United States Patent
Imamoto

(10) Patent No.: US 10,803,946 B2
(45) Date of Patent: Oct. 13, 2020

(54) SEMICONDUCTOR MEMORY DEVICE

(71) Applicant: TOSHIBA MEMORY CORPORATION, Minato-ku, Tokyo (JP)

(72) Inventor: Akihiro Imamoto, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/537,655

(22) Filed: Aug. 12, 2019

(65) Prior Publication Data

US 2020/0202934 A1    Jun. 25, 2020

(30) Foreign Application Priority Data

Dec. 19, 2018 (JP) ................. 2018-237419

(51) Int. Cl.
| | |
|---|---|
| *G11C 16/08* | (2006.01) |
| *G11C 16/04* | (2006.01) |
| *G11C 16/10* | (2006.01) |
| *G11C 16/26* | (2006.01) |
| *G06F 3/06* | (2006.01) |
| *G11C 16/34* | (2006.01) |

(52) U.S. Cl.
CPC ........ *G11C 16/0483* (2013.01); *G06F 3/0604* (2013.01); *G06F 3/0655* (2013.01); *G06F 3/0679* (2013.01); *G11C 16/08* (2013.01); *G11C 16/10* (2013.01); *G11C 16/26* (2013.01); *G11C 16/3459* (2013.01)

(58) Field of Classification Search
CPC ..... G11C 16/0483; G11C 16/08; G11C 16/10; G11C 16/26; G06F 3/0604; G06F 3/0655

USPC ........................................... 365/185.17
See application file for complete search history.

(56) References Cited

U.S. PATENT DOCUMENTS

| | | | |
|---|---|---|---|
| 5,909,404 A * | 6/1999 | Schwarz ............... | G11C 29/50 365/200 |
| 6,288,923 B1 | 9/2001 | Sakamoto | |
| 6,434,058 B2 | 8/2002 | Kanazashi | |
| 6,667,913 B2 | 12/2003 | Okuda et al. | |
| 7,224,614 B1 | 5/2007 | Chan | |
| 7,843,742 B2 | 11/2010 | Sunaga et al. | |
| 10,140,059 B2 | 11/2018 | Tokiwa | |

(Continued)

FOREIGN PATENT DOCUMENTS

| | | |
|---|---|---|
| JP | 2001155488 A | 6/2001 |
| JP | 2003331577 A | 11/2003 |

(Continued)

*Primary Examiner* — Harry W Byrne
(74) *Attorney, Agent, or Firm* — Holtz, Holtz & Volek PC

(57) ABSTRACT

According to one embodiment, a semiconductor memory device includes: planes each including a memory cell array including memory cells; a comparator configured to, when suspending a write operation and executing a read operation, compare a first plane address corresponding to the write operation with a second plane address corresponding to the read operation; and a controller configured to suspend the write operation and execute the read operation. The controller is configured to, based on an output signal from the comparator, execute the first read operation when the first and second plane addresses match, and execute the second read operation when the first and second plane addresses differ.

18 Claims, 20 Drawing Sheets

(56) References Cited

U.S. PATENT DOCUMENTS

| | | | |
|---|---|---|---|
| 2006/0069528 A9* | 3/2006 | Akutsu | B82Y 15/00 702/185 |
| 2008/0238541 A1* | 10/2008 | Fasoli | G11C 8/14 330/124 R |
| 2008/0239839 A1* | 10/2008 | Fasoli | G11C 7/1042 365/189.11 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |

FOREIGN PATENT DOCUMENTS

| | | |
|---|---|---|
| JP | 4588158 B2 | 9/2010 |
| JP | 5043662 B2 | 7/2012 |
| JP | 2017041287 A | 2/2017 |

* cited by examiner

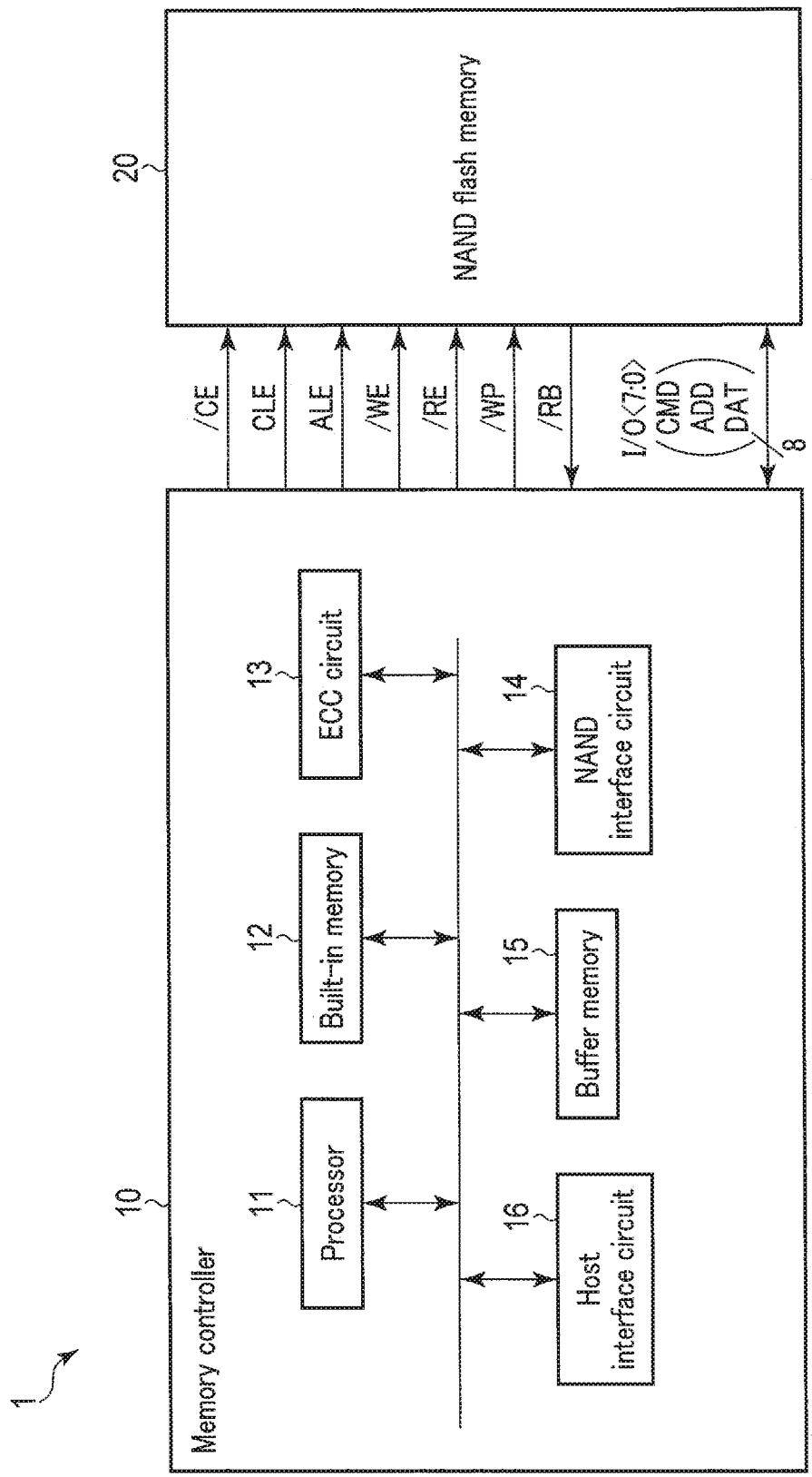
F I G. 1

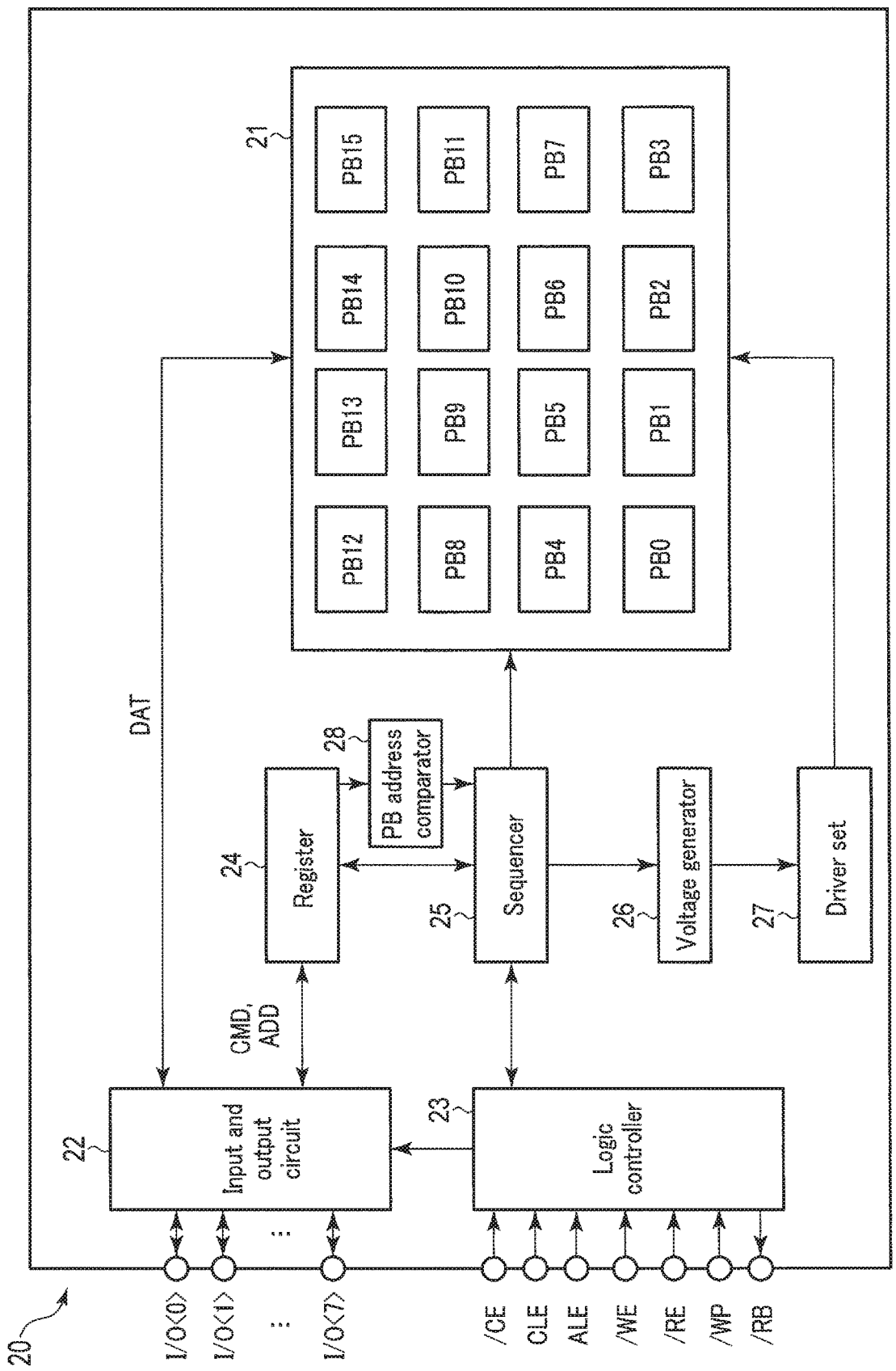
F I G. 2

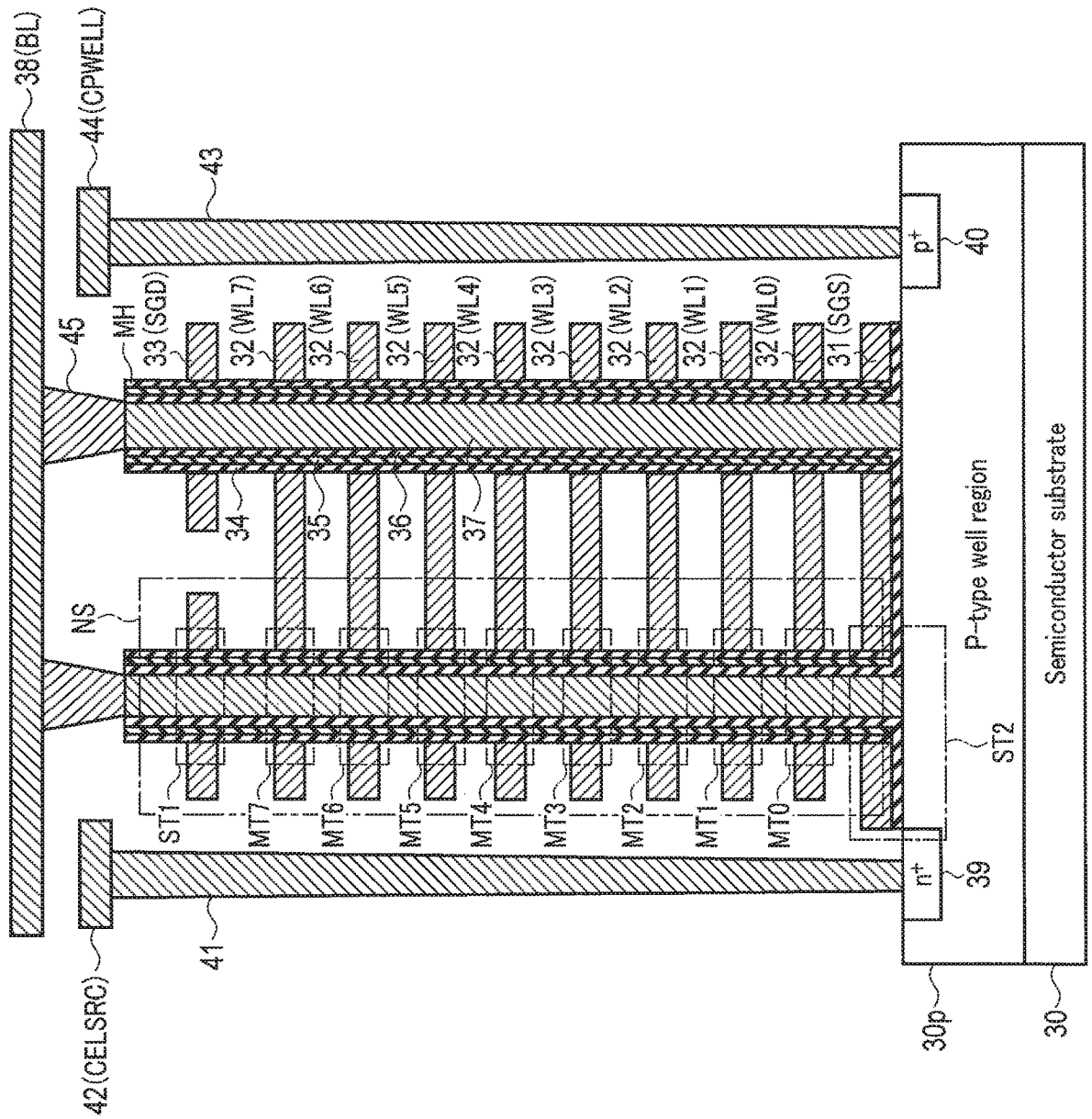
F I G. 5

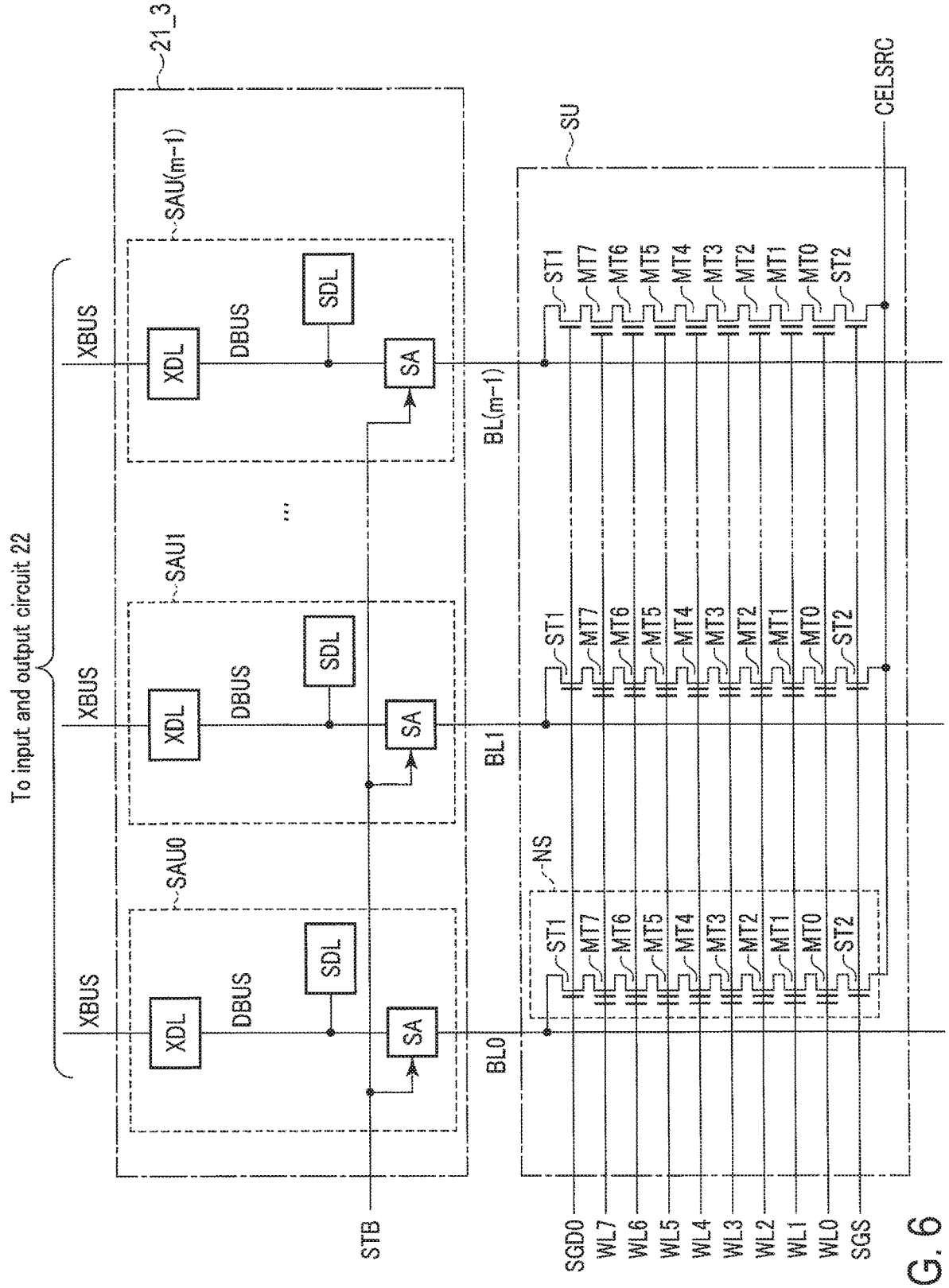
F I G. 6

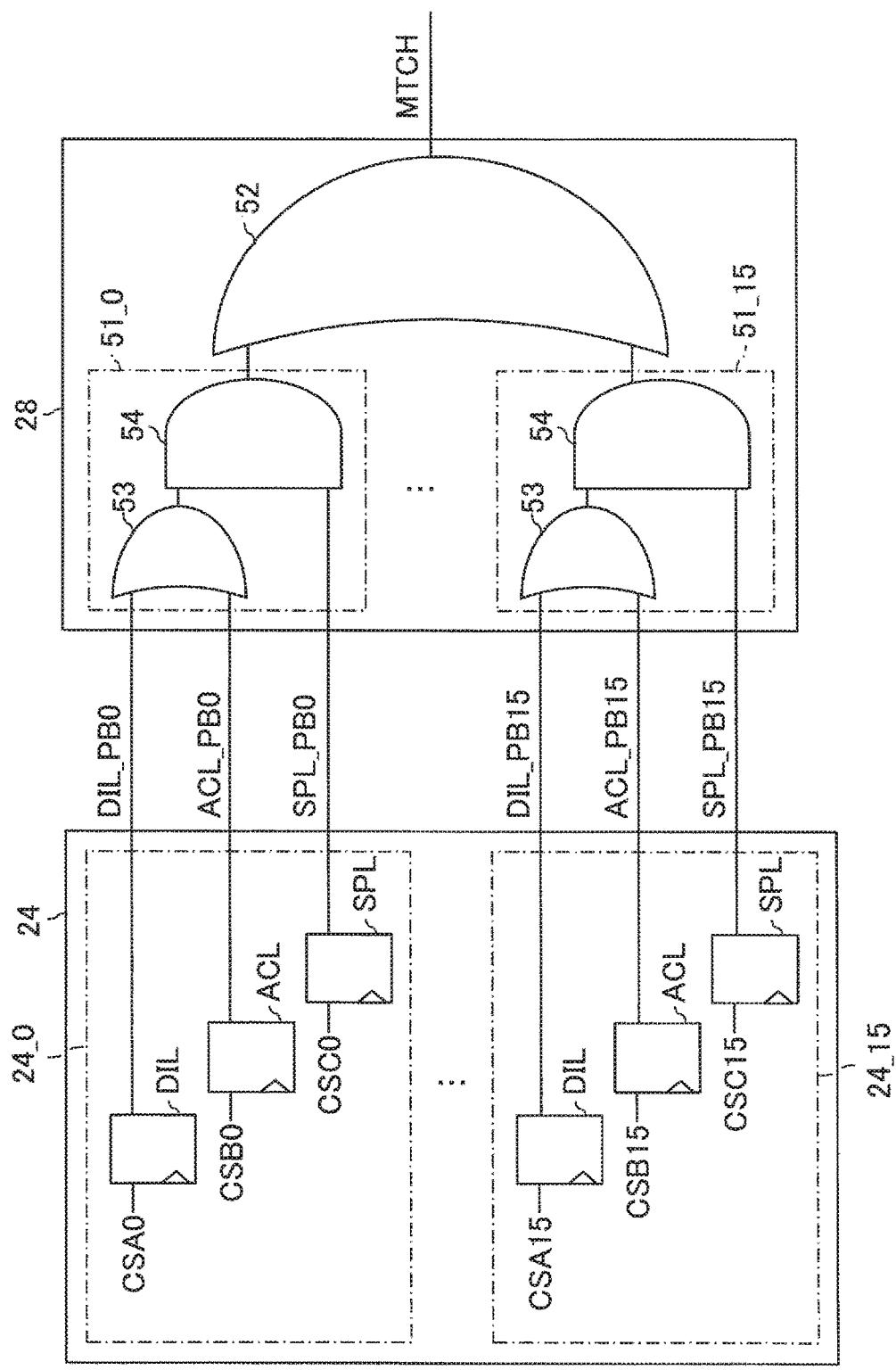
F I G. 8

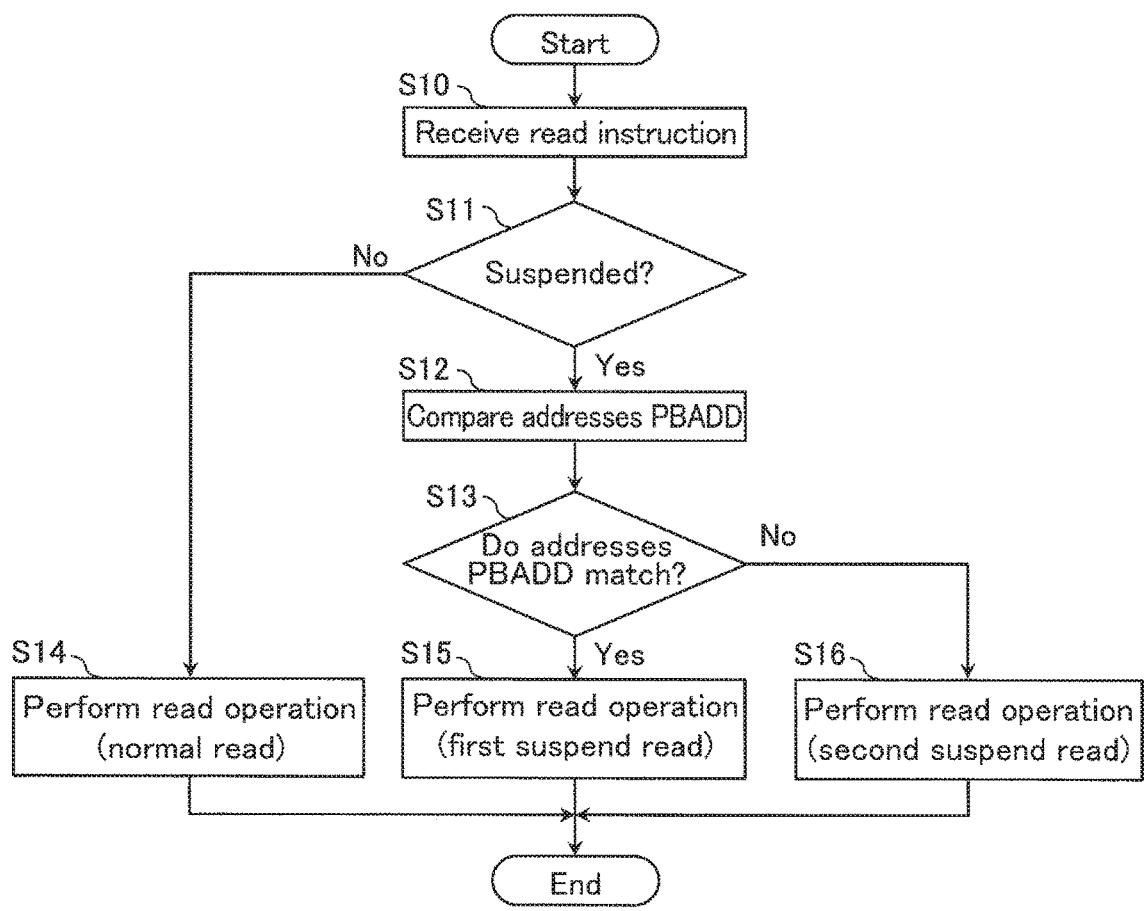
F I G. 10

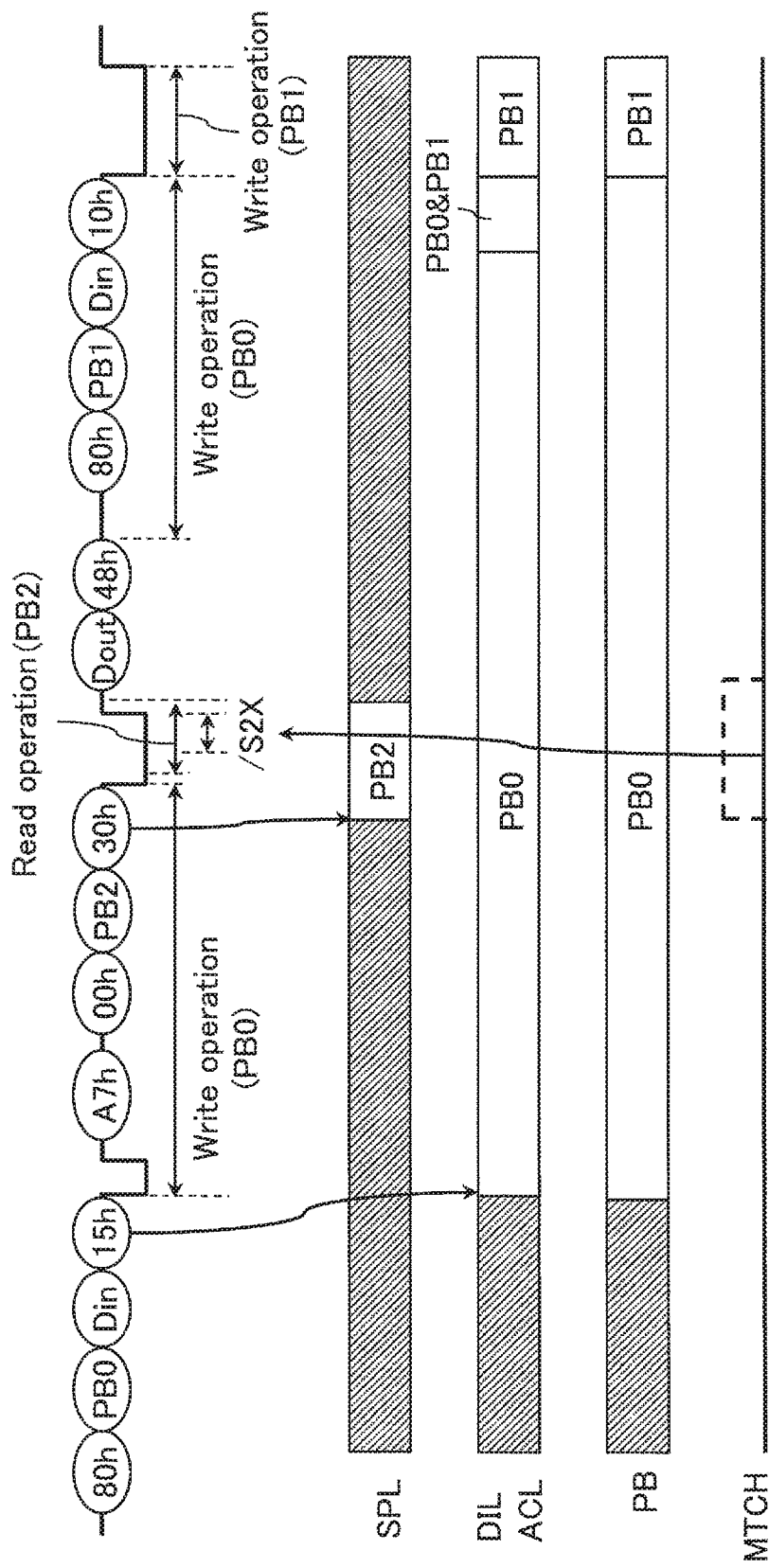
F I G. 14

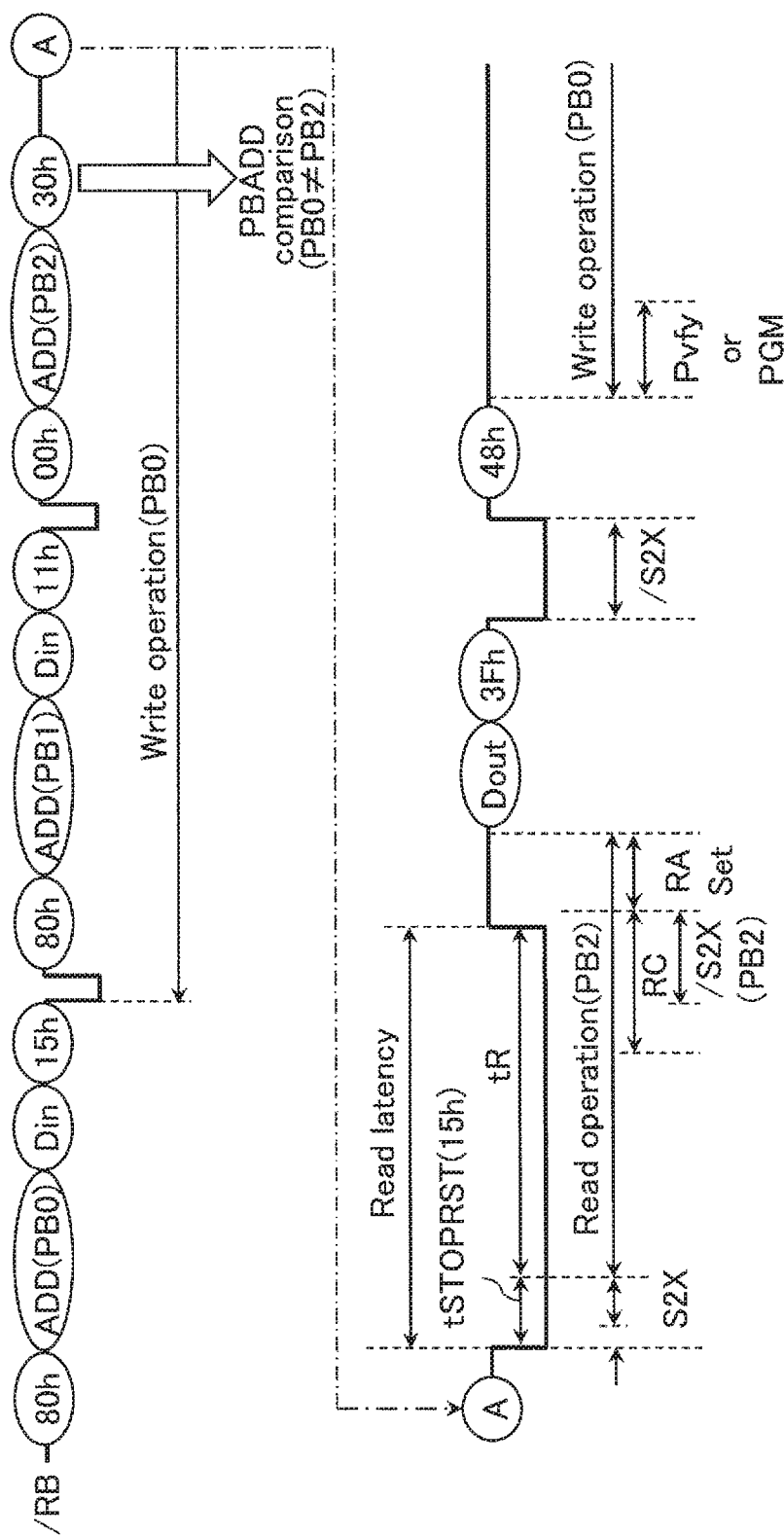
F I G. 16

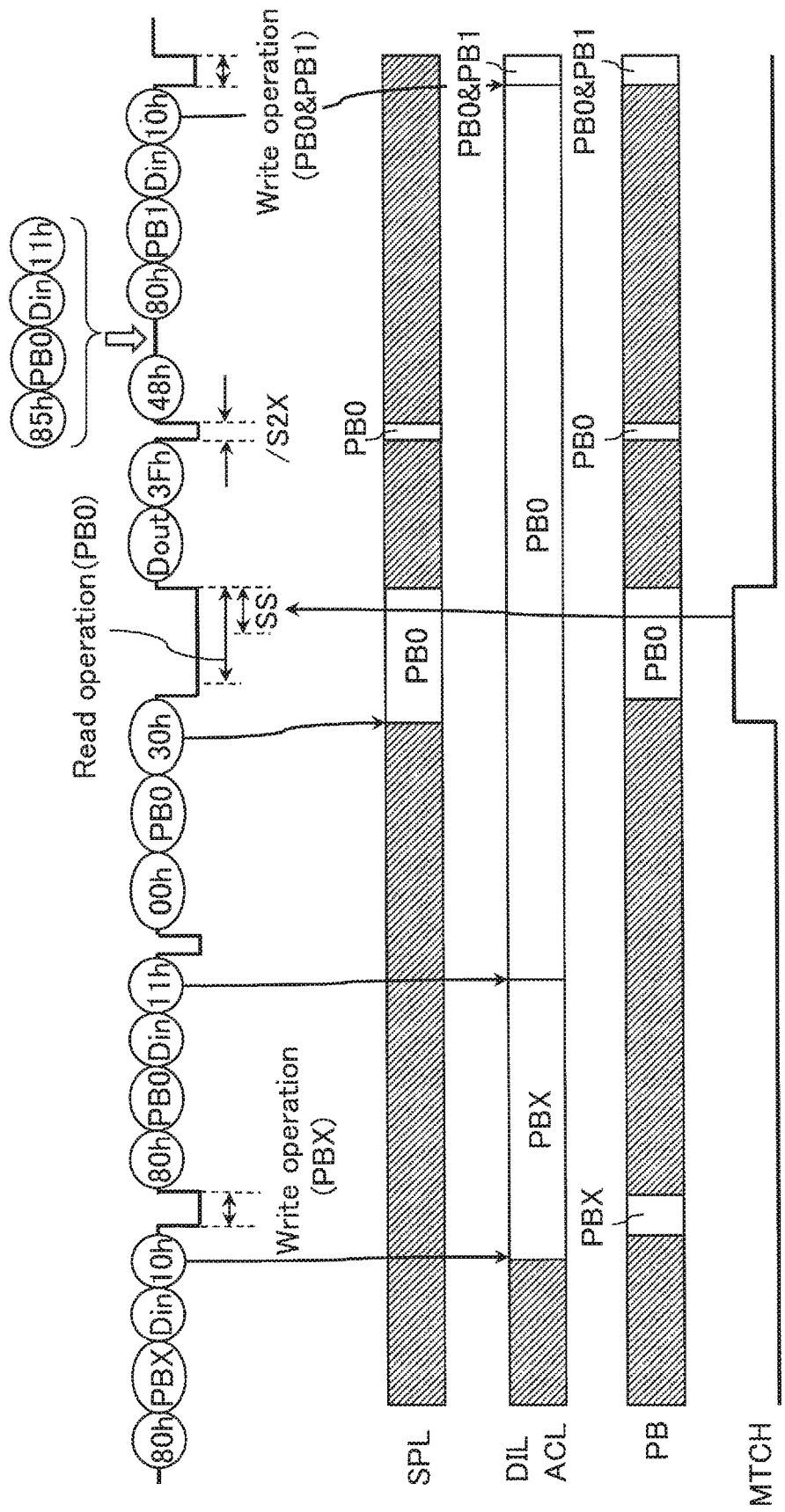
F I G. 17

SEMICONDUCTOR MEMORY DEVICE

CROSS-REFERENCE TO RELATED APPLICATIONS

This application is based upon and claims the benefit of priority from Japanese Patent Application No. 2018-237419, filed Dec. 19, 2018, the entire contents of which are incorporated herein by reference.

FIELD

Embodiments described herein relate generally to a semiconductor memory device.

BACKGROUND

As a semiconductor memory device, a NAND flash memory has been known.

BRIEF DESCRIPTION OF THE DRAWING

FIG. 1 is a block diagram of a memory system including a semiconductor memory device according to the first embodiment;

FIG. 2 is a block diagram of the semiconductor memory device according to the first embodiment;

FIG. 5 is a cross-sectional view of a memory cell array of the semiconductor memory device according to the first embodiment;

FIG. 6 is a block diagram of a sense amplifier module of the semiconductor memory device according to the first embodiment;

FIG. 8 is a block diagram of a PB address comparator of the semiconductor memory device according to the first embodiment;

FIG. 10 is a flowchart showing a read operation in the semiconductor memory device according to the first embodiment;

FIG. 14 shows an example of a command sequence related to the second suspend read operation and an example of a timing chart of each type of signal in the semiconductor memory device according to the first embodiment;

FIG. 16 is a timing chart showing a command sequence and the signal /RB when a second suspend read operation is executed in a plane PB2 after suspension of synchronous write operations in a plurality of planes PB in the semiconductor memory device according to the second embodiment;

FIG. 17 shows an example of a command sequence accompanying related to the first suspend read operation and an example of a timing chart of various signals in the semiconductor memory device according to a first example of the second embodiment;

DETAILED DESCRIPTION

Figure 3:
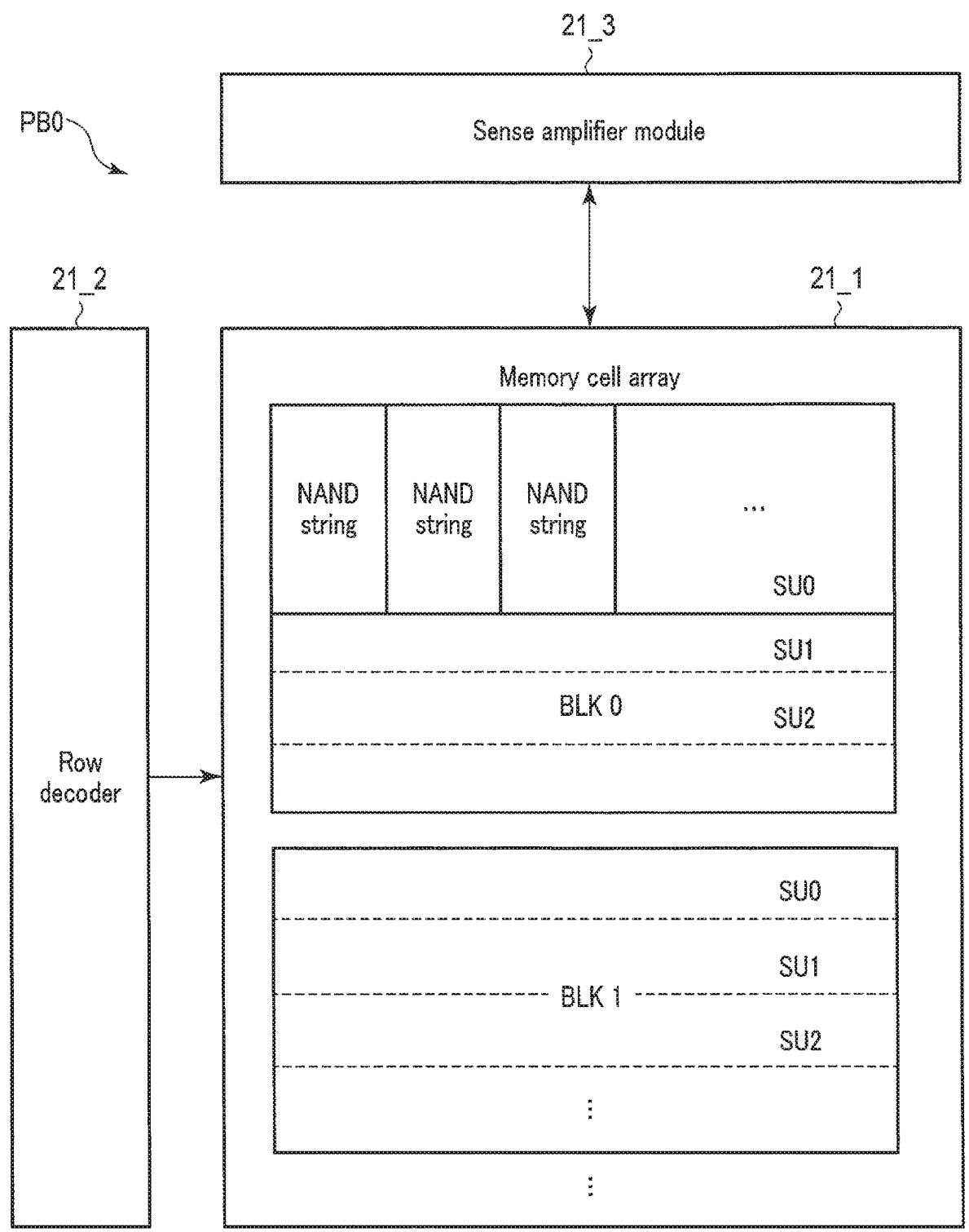
FIG. 3 is a block diagram of a plane of the semiconductor memory device according to the first embodiment.

In general, according to one embodiment, a semiconductor memory device includes: a plurality of planes each including a memory cell array including a plurality of memory cells; a comparator configured to, when suspending a write operation and executing a read operation, compare a first plane address corresponding to the write operation with a second plane address corresponding to the read operation; and a controller configured to suspend the write operation and execute the read operation. The read operation includes a first read operation and a second read operation. The controller is configured to, based on an output signal from the comparator, execute the first read operation when the first plane address corresponding to the write operation matches the second plane address corresponding the read operation, and execute the second read operation when the first plane address corresponding to the write operation differs from the second plane address corresponding the read operation.

1. First Embodiment

A semiconductor memory device according to the first embodiment will be described. The following will exemplify, as a semiconductor memory device, a three-dimensional stack NAND flash memory obtained by three-dimensionally stacking memory cell transistors on a semiconductor substrate.

1.1 Arrangement

The arrangement of the semiconductor memory device according to the first embodiment will be described first.

1.1.1 Overall Configuration of Memory System

FIG. 1 is a block diagram showing an example of a configuration of a memory system including a semiconductor memory device according to the first embodiment. A memory system 1 communicates with an external host device (not shown). The memory system 1 holds data from the host device (not shown) and reads data to the host device.

As shown in FIG. 1, the memory system 1 includes a memory controller 10 and a semiconductor memory device (NAND flash memory) 20. The memory controller 10 receives an instruction from the host device and controls the semiconductor memory device 20 based on the received instruction. More specifically, the memory controller 10 writes, in the semiconductor memory device 20, data instructed to be written by the host device, and reads data instructed to be read by the host device from the semiconductor memory device 20 and transmits the data to the host device. The memory controller 10 is coupled to the semiconductor memory device 20 via a NAND bus. The semiconductor memory device 20 includes a plurality of memory cells and stores data in a nonvolatile manner.

The NAND bus transmits and receives each of the following signals complying with a NAND interface: signals /EC, CLE, ALE, /WE, /RE, /WP, /RB, and I/O <7:0> via an individual signal line. The signal /CE is a signal for enabling the semiconductor memory device 20. The signal CLE informs the semiconductor memory device 20 that the signal I/O <7:0> flowing in the semiconductor memory device 20 while the signal CLE is at "H (High)" level is a command. The signal ALE informs the semiconductor memory device 20 that the signal I/O <7:0> flowing in the semiconductor memory device 20 while the signal ALE is at "H" level is an address. The signal /WE instructs the semiconductor memory device 20 to take in the signal I/O <7:0> flowing in the semiconductor memory device 20 in the semiconductor memory device 20 while the signal /WE is at "L (Low)" level. A signal /RE instructs the semiconductor memory device 20 to output the signal I/O <7:0>. The signal /WP instructs the semiconductor memory device 20 to inhibit a data write and erase. The signal /RB indicates whether the semiconductor memory device 20 is in a ready state (ready to accept an external instruction) or in a busy state (not ready to accept any external instruction). The signal I/O <7:0> is, for example, an 8-bit signal. The signal I/O <7:0> is the entity of data transmitted and received between the semiconductor memory device 20 and the memory controller 10, and includes a command CMD, an address ADD, and data DAT. The data DAT includes write data and read data.

1.1.2 Configuration of Memory Controller

The memory controller of the memory system according to the first embodiment will now be described below with reference to FIG. 1. The memory controller 10 includes a processor (CPU: Central Processing Unit) 11, a built-in memory (RAM: Random Access Memory) 12, an ECC (Error Check and Correction) circuit 13, a NAND interface circuit 14, a buffer memory 15, and a host interface circuit 16.

The processor 11 controls the overall operation of the memory controller 10. For example, the processor 11 issues a read instruction based on the NAND interface to the semiconductor memory device 20 in response to a data-read instruction received from the host device. This operation applies to a write and erase operation. The processor 11 also has a function of executing various types of computations on the data read from the semiconductor memory device 20.

The built-in memory 12 is, for example, a semiconductor memory such as a DRAM (Dynamic RAM), and is used as a work area for the processor 11. The built-in memory 12 holds firmware for managing the semiconductor memory device 20, various types of management tables, and the like.

The ECC circuit 13 performs error detection and error correction processing. More specifically, in a data write operation, the ECC circuit 13 generates an ECC code for each set of a certain number of data based on the data received from the host device. In a data read operation, the ECC circuit 13 performs ECC decoding based on an ECC code, and detects the presence/absence of an error. Upon detecting an error, the ECC circuit 13 specifies the bit position of the error and corrects the error.

The NAND interface circuit 14 is coupled to the semiconductor memory device 20 via a NAN bus, and controls communications with the semiconductor memory device 20. The NAND interface circuit 14 transmits the command CMD, the address ADD, and write data to the semiconductor memory device 20 in response to an instruction from the processor 11. In addition, the NAND interface circuit 14 receives the data read from the semiconductor memory device 20.

The buffer memory 15 temporarily holds the data and the like received from the semiconductor memory device 20 and the host device to the memory controller 10. The buffer memory 15 is also used as a memory area for temporarily holding, for example, the data read from the semiconductor memory device 20 and a computation result on the read data.

The host interface circuit 16 is coupled to the host device and controls communications with the host device. The host interface circuit 16 transfers, for example, the instruction and data received from the host device to the processor 11 and the buffer memory 15.

1.1.3 Configuration of Semiconductor Memory Device

An example of the configuration of the semiconductor memory device according to the first embodiment will be described next with reference to FIG. 2. FIG. 2 is a block diagram showing an example of the configuration of the semiconductor memory device according to the first embodiment. Note that in the case shown in FIG. 2, some of the couplings between the blocks are indicated by arrows, but the couplings between the blocks are not limited to this.

As shown in FIG. 2, the semiconductor memory device 20 includes a core unit 21, an input and output circuit 22, a logic controller 23, a register 24, a sequencer 25, a voltage generator 26, a driver set 27, and a PB address comparator 28.

The core unit 21 includes, for example, sixteen planes PB, i.e., PB0, PB1, . . . , PB15. Each plane PB performs each of the operations described above for each block (not shown) including a plurality of memory cell transistors (not shown). More specifically, for example, each plane PB performs a data write operation for some memory cell transistors in a given block and a data read operation or a data erase operation for all the memory cell transistors in a given block. Note that in this embodiment, each of the planes PB0 to PB15 has the same configuration unless specifically described. The details of the configuration of the plane PB will be described later. Note that the number of planes PB is not limited to sixteen. The number of planes PB is only required to be one or more.

The input and output circuit 22 transmits and receives the signal I/O <7:0> to and from the memory controller 10. The input and output circuit 22 transfers the command CMD and the address ADD in the signal I/O <7:0> to the register 24. The input and output circuit 22 transmits and receives write data and read data (data DAT) to and from the core unit 21.

The logic controller 23 receives the signals /CE, CLE, ALE, /WE, /RE, and/WP from the memory controller 10. The logic controller 23 transfers the signal /RB to the memory controller 10 to inform the outside of the state of the semiconductor memory device 20.

The register 24 holds the command CMD and the address ADD. The register 24 transfers, for example, the address ADD and the command CMD to the sequencer 25. The register 24 also transfers a plane address PBADD included in the address ADD or a signal based on the plane address PBADD to the PB address comparator 28.

The sequencer 25 receives a command set including the command CMD and the address ADD and controls the whole of the semiconductor memory device 20 in accordance with the sequence based on the received command set. The sequencer 25 can cause a plurality of planes PB in the core unit 21 to synchronously perform data read operations and write operations or erase operations, for example, by outputting control signals.

The sequencer 25 has a function of temporarily suspending a write operation or erase operation upon receiving, for example, a read instruction from the memory controller 10 midway along the write operation or erase operation, executing a read operation (instruction) or the like, and then resuming the suspended write operation or the like. This embodiment will exemplify a case in which a write operation is suspended, and a read operation is executed.

The voltage generator 26 generates voltages required for a data write operation, a data read operation, and a data erase operation based on instructions from the sequencer 25. The voltage generator 26 supplies the generated voltages to the driver set 27.

The driver set 27 includes a plurality of drivers, and supplies various voltages from the voltage generator 26 to the core unit 21 based on addresses from the register 24.

The PB address comparator 28 compares the plane address PBADD included in a command set corresponding to a write operation received from the memory controller 10, the plane address PBADD where a write operation is being executed, and the plane address PBADD for a read operation for which the write operation is suspended, and transmits the comparison result to the sequencer 25. The PB address comparator will be described in detail later.

1.1.4 Configuration of Plane

The arrangement of a plane of the semiconductor memory device according to the first embodiment will be described next with reference to FIG. 3. FIG. 3 is a block diagram showing an example of the configuration of a plane of the semiconductor memory device according to the first embodiment. FIG. 3 shows the plane PB0 as an example. The other planes PB have the same configuration.

As shown in FIG. 3, the plane PB0 includes a memory cell array 21_1, a row decoder 21_2, and a sense amplifier module 21_3.

The memory cell array 21_1 includes a plurality of blocks BLK, i.e., BLK0, BLK1, . . . . The blocks BLK are distinguished with, for example, block addresses identifiable from each other. Note that the planes PB other than the plane PB0 include the blocks BLK corresponding to the same block address as that in the plane PB0. The blocks BLK in the different planes PB to which the same block address is assigned are distinguished with the plane addresses PBADD identifiable from each other. The block BLK includes a plurality of nonvolatile memory cell transistors (not shown) associated with word lines and bit lines. The block BLK is, for example, a unit of data erasure. The data in the same block BLK are erased together. Each block BLK includes a plurality of string units SU, i.e., SU0, SU1, . . . . Each string unit SU includes a plurality of NAND strings NS. Note that the number of blocks in the memory cell array 21_1, the number of string units in one block BLK, and the number of NAND strings in one string unit SU can be set to any numbers.

The row decoder 21_2 selects a block BLK or the like based on the block address in the address ADD held in the register 24. The driver set 27 then transfers voltages to the selected block BLK via the row decoder 21_2.

In a data read operation, the sense amplifier module 21_3 reads data by sensing the threshold voltages of memory cell transistors, and transfers the data to the input and output circuit 22. In a data write operation, the sense amplifier module 21_3 transfers the write data to be written via bit lines to the corresponding memory cell transistors. In addition, the sense amplifier module 21_3 receives the column address in the address ADD from the register 24, and outputs data of the column based on the column address.

1.1.5 Circuit Arrangement of Memory Cell Array

Figure 4:
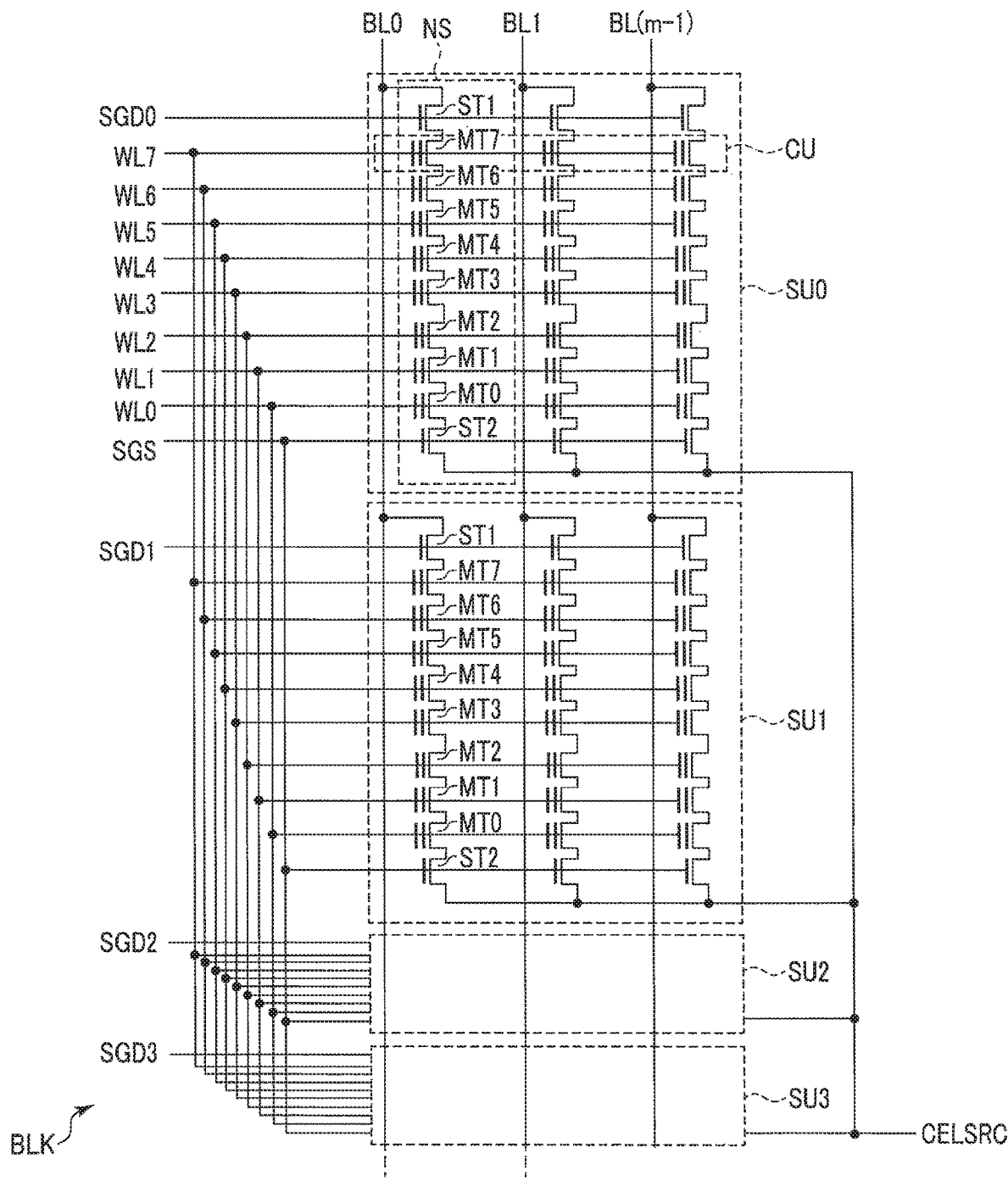
FIG. 4 is a circuit diagram of a memory cell array of the semiconductor memory device according to the first embodiment.

The circuit configuration of a memory cell array of the semiconductor memory device according to the first embodiment will be described with reference to FIG. 4. FIG. 4 is an example of a circuit diagram for explaining the configuration of a memory cell array of the semiconductor memory device according to the first embodiment. FIG. 4 shows a circuit diagram of one block BLK of the memory cell array 21_1.

As shown in FIG. 4, each string unit SU is constituted by a set of NAND strings NS. Each of the NAND strings NS includes, for example, eight memory cell transistors MT, i.e., MT0 to MT7, a select transistor ST1, and a select transistor ST2. Note that the number of memory cell transistors MT is not limited to eight and may be, for example, 16, 32, 64, 96, or 128. That is, the number of memory cell transistors is not specifically limited. Each memory cell transistor MT includes a multilayer gate including a control gate and a charge storage layer. The memory cell transistors MT are serially coupled between the select transistors ST1 and ST2. Note that in the following description, a case of "coupling" conductive elements includes a case of coupling them via another conductive element.

In a given block BLK, the gates of the select transistors ST1 of the string units SU0 to SU3 are respectively coupled to select gate lines SGD0 to SGD3. The gates of the select transistors ST2 of all the string units SU in the block BLK are commonly coupled to a select gate line SGS. The control gates of the memory cell transistors MT0 to MT7 in the same block BLK are respectively coupled to word lines WL0 to WL7. That is, the word lines WL with the same address are commonly coupled to all the string units SU in the same block BLK, and the select gate line SGS is commonly coupled to all the string units SU in the same block BLK. In contrast to this, the select gate line SGD is coupled to one string unit SU in the same block BLK.

Of the NAND strings NS arranged in a matrix in the memory cell array 21_1, the other terminal of each of the select transistors ST1 of the NAND strings NS in the same row is coupled to a corresponding one of m bit lines BL, i.e., BL0 to BL(m−1) (where m is a natural number). In addition, each bit line BL is commonly coupled to the NAND strings NS on the same column throughout a plurality of blocks BLK.

The other terminal of each select transistor ST2 is coupled to a source line CELSRC. The source line CELSRC is commonly coupled to a plurality of NAND strings NS throughout a plurality of blocks BLK.

As described above, a data erase operation is performed on, for example, the memory cell transistors MT in the same block BLK together. In contrast to this, a data read operation and a data write operation can be performed on a plurality of memory cell transistors MT commonly coupled to a given word line WL in a given string unit SU in a given block BLK. A set of memory cell transistors MT sharing one word line WL in one string unit SU is called, for example, a cell unit CU. That is, the cell unit CU is a set of memory cell transistors MT on which a write operation or read operation can be executed together.

Note that one memory cell transistor MT can hold, for example, data of one or a plurality of bits. A set of bits respectively held by the memory cell transistors MT at the same bit positions in the same cell unit CU is called a "page". That is, a "page" can also be defined as part of a memory space formed by a set of memory cell transistors MT in the same cell unit CU.

For the sake of simplicity, the following will describe a case in which one memory cell transistor MT can hold one-bit data.

1.1.6 Cross-Sectional Arrangement of Memory Cell Array

A cross-sectional structure of the memory cell array 21_1 will be described next with reference to FIG. 5. FIG. 5 shows an example of the cross-sectional structure of the memory cell array of the semiconductor memory device according to the first embodiment. FIG. 5 shows a portion associated with the two string units SU in one block BLK. More specifically, FIG. 5 shows two respective NAND strings NS of two string units SU and their surrounding portions. A plurality of arrangements each identical to that shown in FIG. 5 are arrayed in the X direction. For example, a set of NAND strings NS arranged in the X direction corresponds to one string unit SU.

The memory cell array 21_1 is provided on a semiconductor substrate 30. Assume that in the following description, a plane parallel to the surface of the semiconductor substrate 30 is defined as an XY plane, and a direction perpendicular to the XY plane is defined as the Z direction. Assume also that the X direction and the Y direction are perpendicular to each other.

A p-type well region 30p is provided in an upper portion of the semiconductor substrate 30. A plurality of NAND strings NS are provided on the p-type well region 30p. That is, for example, an interconnect layer 31 functioning as the select gate line SGS, eight interconnect layers 32 functioning as the word lines WL0 to WL7, and an interconnect layer 33 functioning as the select gate line SGD are sequentially stacked on the p-type well region 30p. A plurality of layers each identical to the interconnect layer 31 may be stacked on each other, and a plurality of layers each identical to the interconnect layer 33 may be stacked on each other. Insulating films (not shown) are provided between the stacked interconnect layers 31 to 33.

The interconnect layer 31 is commonly coupled to, for example, the gates of the respective select transistors ST2 of the plurality of NAND strings NS in one block BLK. Each interconnect layer 32 is commonly coupled to the control gates of the respective memory cell transistors MT of each of the plurality of NAND strings NS in one block BLK. The interconnect layer 33 is commonly coupled to the gates of the respective select transistors ST1 of the plurality of NAND strings NS in one string unit SU.

A memory hole MH is provided to reach the p-type well region 30p through the interconnect layers 33, 32, and 31. A block insulating film 34, a charge storage layer (insulating film) 35, and a tunnel oxide film 36 are sequentially provided on a side surface of the memory hole MH. A semiconductor pillar (conductive film) 37 is buried in the memory hole MH. The semiconductor pillar 37 is, for example, non-doped polysilicon, and functions as a current path of the NAND string NS. An interconnect layer 38 functioning as a bit line BL is provided above the semiconductor pillar 37. The semiconductor pillar 37 is coupled to the interconnect layer 38 via a contact plug 45.

As described above, the select transistor ST2, the plurality of memory cell transistors MT, and the select transistor ST1 are sequentially stacked on the p-type well region 30p, and one memory hole MH corresponds to one NAND string NS.

An $n^+$-type impurity diffusion region 39 and $p^+$-type impurity diffusion region 40 are provided in upper portions of the p-type well region 30p. A contact plug 41 is provided on the upper surface of the $n^+$-type impurity diffusion region 39. An interconnect layer 42 functioning as the source line CELSRC is proved on the upper surface of the contact plug 41. A contact plug 43 is provided on the upper surface of the $p^+$-type impurity diffusion region 40. An interconnect layer 44 functioning as a well line CPWELL is provided on the upper surface of the contact plug 43.

Note that the memory cell array 21_1 may have another arrangement. The arrangement of the memory cell array 21_1 is disclosed in U.S. patent application Ser. No. 12/407,403, "THREE-DIMENSIONAL STACK NONVOLATILE SEMICONDUCTOR MEMORY", filed on Mar. 19, 2009. In addition, this arrangement is disclosed in U.S. patent application Ser. No. 12/406,524, "THREE-DIMENSIONAL STACK NONVOLATILE SEMICONDUCTOR MEMORY", filed on Mar. 18, 2009, U.S. patent application Ser. No. 12/679,991, "NON-VOLATILE SEMICONDUCTOR STORAGE DEVICE AND METHOD OF MANUFACTURING THE SAME", filed on Mar. 25, 2010, and U.S. patent application Ser. No. 12/532,030, "SEMICONDUCTOR MEMORY AND METHOD OF MANUFACTURING THE SAME", filed on Mar. 23, 2009. These patent applications are incorporated by reference as a whole in the specification of the present application.

1.1.7 Configuration of Sense Amplifier Module

The arrangement of the sense amplifier module of the semiconductor memory device according to the first embodiment will be described next with reference to FIG. 6. FIG. 6 is a block diagram for explaining an example of a configuration of the sense amplifier module of the semiconductor memory device according to the first embodiment.

As shown in FIG. 6, the sense amplifier module 21_3 includes sense amplifier units SAU, i.e., SAU0, SAU1, . . . , SAU(m−1) provided for the respective bit lines BL.

Each sense amplifier unit SAU includes a sense amplifier SA, a latch circuit SDL, and a latch circuit XDL. Note that the sense amplifier unit SAU may have a plurality of latch circuits other than the latch circuits SDL and XDL in correspondence with, for example, the number of bits of data that the memory cell transistor MT can hold.

Each sense amplifier SA reads data by sensing the threshold voltage of the memory cell transistor MT with the voltage or current of the corresponding bit line BL, or applies a voltage to the bit line BL in accordance with write data. That is, the sense amplifier SA directly controls the bit line BL. In a read operation, for example, the sequencer 25 supplies a strobe signal to the sense amplifiers SA via a node STB. Each sense amplifier SA determines read data at the assertion timing of the strobe signal and causes the latch circuit SDL to hold the data.

The latch circuit SDL temporarily holds the read data read by the sense amplifier SA and the write data to be written by the sense amplifier SA. As will be described later, in each sense amplifier unit SAU, the sense amplifier SA includes a node SEN, and the latch circuits SDL and XDL are coupled to each other via a bus DBUS. The node SEN and the bus DBUS have large parasitic capacitances and hence can be used as temporary latches. For example, temporarily deploying the data held in the latch circuits SDL and XDL into the node SEN and the bus DBUS enables various types of logical operations for the data, such as a negation (NOT) operation, logical sum (OR) operation, logical product (AND) operation, negative logical product (NAND) operation, negative logical sum (NOR) operation, and exclusive logical sum (XOR) operation.

The sense amplifier SA and the latch circuit SDL are coupled to a common node so as to allow them to transmit and receive data to and from each other. The latch circuit XDL is also coupled to the sense amplifier SA and the latch circuit SDL via the bus DBUS.

The sense amplifier module 21_3 performs a data input and output operation via the latch circuit XDL. That is, the data received from the memory controller 10 is transferred from the input and output circuit 22 to the latch circuit XDL via an input and output bus XBUS and then transmitted to the latch circuit SDL or the sense amplifier SA. In addition, data in the latch circuit SDL or the sense amplifier SA is transferred to the latch circuit XDL via the bus DBUS and then transmitted via the input and output bus XBUS to the input and output circuit 22 or the memory controller 10 beyond the input and output circuit 22. In this manner, the latch circuit XDL functions as a cache memory of the semiconductor memory device 20 which is series-coupled between the input and output circuit 22 and the sense amplifier SA. Accordingly, even if the latch circuit SDL is in use, the semiconductor memory device 20 can be set in a ready state as long as the latch circuit XDL is available (in a released state). In contrast to this, when the latch circuit XDL is in use, the semiconductor memory device 20 cannot be in the ready state except for a limited case such as a cache program operation (to be described later).

1.1.8 Configuration of Sense Amplifier Unit

Figure 7:
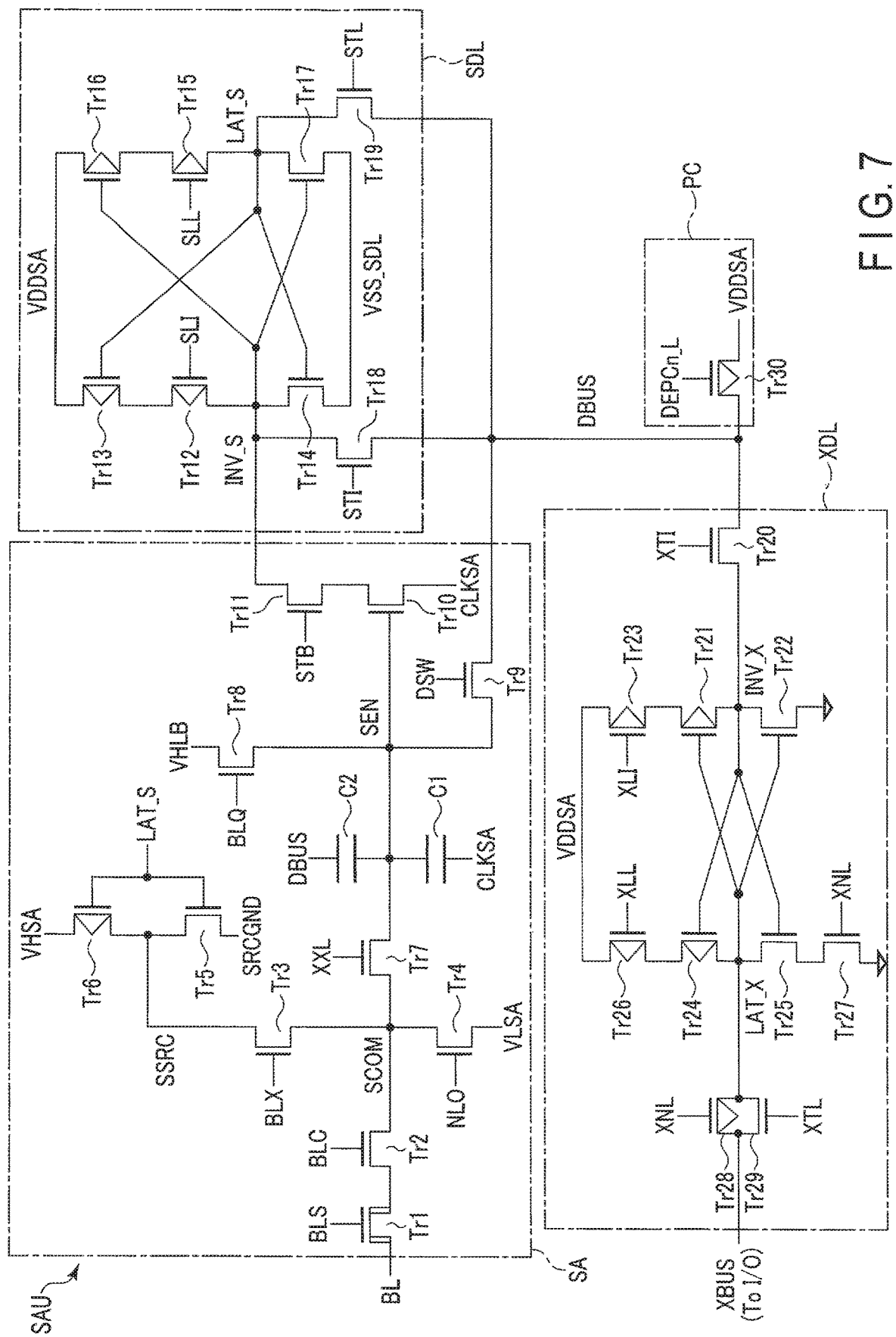
FIG. 7 is a circuit diagram of a sense amplifier unit of the semiconductor memory device according to the first embodiment.

The configuration of the sense amplifier unit will be described next with reference to FIG. 7. FIG. 7 is a circuit diagram for explaining an example of a configuration of the sense amplifier unit of the semiconductor memory device according to the first embodiment.

As shown in FIG. 7, the sense amplifier unit SAU includes the sense amplifier SA, the latch circuit SDL, the latch circuit XDL, and a precharge circuit PC.

The sense amplifier SA includes transistors Tr1, Tr2, Tr3, Tr4, Tr5, Tr6, Tr7, Tr8, Tr9, Tr10, and Tr11 and capacitors C1 and C2. For example, the transistor Tr1 is a high-voltage n-channel MOSFET (to be also referred to as an "nMOS transistor" hereinafter), and the transistors Tr2 to Tr5 and Tr7 to Tr11 are low-voltage nMOS transistors. For example, the transistor Tr6 is a low-voltage p-channel MOSFET (to be also referred to as a "pMOS transistor" hereinafter).

The transistor Tr1 includes a first terminal coupled to a bit line BL, a second terminal coupled to the first terminal of the transistor Tr2, and a gate coupled to a node BLS. The transistor Tr2 includes a second terminal coupled to a node SCOM and a gate coupled to a node BLC.

The transistor Tr3 includes a first terminal coupled to the node SCOM, a second terminal coupled to a node SSRC, and a gate coupled to a node BLX. The transistor Tr4 includes a first terminal coupled to the node SCOM, a second terminal coupled to a node VLSA, and a gate coupled to a node NLO.

The transistor Tr5 includes a first terminal coupled to the node SSRC, a second terminal coupled to a node SRCGND, and a gate coupled to a node LAT_S. The transistor Tr6 includes a first terminal coupled to the node SSRC, a second terminal couple to a node VHSA, and a gate coupled to the node LAT_S.

The transistor Tr7 includes a first terminal coupled to the node SCOM, a second terminal coupled to the node SEN, and a gate coupled to a node XXL. The capacitor C1 includes a first terminal coupled to the node SEN and a second terminal coupled to a node CLKSA. The capacitor C2 includes a first terminal coupled to the node SEN and a second terminal coupled to the bus DBUS.

The transistor Tr8 includes a first terminal coupled to the node SEN, a second terminal coupled to a node VHLB, and a gate coupled to a node BLQ. The transistor Tr9 includes a first terminal coupled to the node SEN, a second terminal coupled to the bus DBUS, and a gate coupled to a node DSW.

The transistor Tr10 includes a first terminal coupled to the node CLKSA, a second terminal coupled to the first terminal of the transistor Tr11, and a gate coupled to the node SEN. The transistor Tr11 includes a second terminal coupled to a node INV_S and a gate coupled to the node STB.

The configuration of the latch circuit SDL will be described next.

The latch circuit SDL includes transistors Tr12, Tr13, Tr14, Tr15, Tr16, Tr17, Tr18, and Tr19. The transistors Tr14 and Tr17 to Tr19 are, for example, nMOS transistors, and the transistors Tr12, Tr13, Tr15, and Tr16 are, for example, pMOS transistors.

The transistor Tr12 includes a first terminal coupled to the node INV_S, a second terminal coupled to the first terminal of the transistor Tr13, and a gate coupled to a node SLI. The transistor Tr13 includes a second terminal coupled to a node VDDSA and a gate coupled to the node LAT_S. The transistor Tr14 includes a first terminal coupled to the node INV_S, a second terminal coupled to a node VSS_SDL, and a gate coupled to the node LAT_S.

The transistor Tr15 includes a first terminal coupled to the node LAT_S, a second terminal coupled to the first terminal of the transistor Tr16, and a gate coupled to a node SLL. The transistor Tr16 includes a second terminal coupled to the node VDDSA and a gate coupled to the node INV_S. The transistor Tr17 includes a first terminal coupled to the node LAT_S, a second terminal coupled to the node VSS_SDL, and a gate coupled to the node INV_S.

The transistor Tr18 includes a first terminal coupled to the node INV_S, a second terminal coupled to the bus DBUS, and a gate coupled to a node STI. The transistor Tr19 includes a first terminal coupled to the node LAT_S, a second terminal coupled to the bus DBUS, and a gate coupled to the node STL.

The configuration of the latch circuit XDL will be described next.

The latch circuit XDL includes transistors Tr20, Tr21, Tr22, Tr23, Tr24, Tr25, Tr26, Tr27, Tr28, and Tr29. The transistors Tr20, Tr22, Tr25, Tr27, and Tr29 are, for example, nMOS transistors. The transistors Tr21, Tr23, Tr24, Tr26, and Tr28 are, for example, pMOS transistors.

The transistor Tr20 includes a first terminal coupled to the bus DBUS, a second terminal coupled to a node INV_X, and a gate coupled to a node XTI.

The transistor Tr21 includes a first terminal coupled to the node INV_X, a second terminal coupled to the first terminal of the transistor Tr23, and a gate coupled to a node LAT_X. The transistor Tr22 includes a first terminal coupled to the node INV_X, a grounded second terminal, and a gate coupled to the node LAT_X. The transistor Tr23 includes a second terminal coupled to the node VDDSA and a gate coupled to a node XLI.

The transistor Tr24 includes a first terminal coupled to the node LAT_X, a second terminal coupled to the first terminal of the transistor Tr26, and a gate coupled to the node INV_X. The transistor Tr25 includes a first terminal coupled to the node LAT_X, a second terminal coupled to the first terminal of the transistor Tr27, and a gate coupled to the node INV_X. The transistor Tr26 includes a second terminal coupled to the node VDDSA and a gate coupled to a node XLL. The transistor Tr27 includes a grounded second terminal and a gate coupled to a node XNL.

The transistor Tr28 includes a first terminal coupled to the node LAT_X, a second terminal coupled to the bus XBUS, and a gate coupled to the node XNL. The transistor Tr29 includes a first terminal coupled to the node LAT_X, a second terminal coupled to the bus XBUS, and a gate coupled to a node XTL. The bus XBUS is used as a path for transferring a signal I/O.

The precharge circuit PC will be described next. The precharge circuit PC is a circuit for charging and discharging the bus DBUS.

The precharge circuit PC includes, for example, a pMOS transistor Tr30. The transistor Tr30 includes a first terminal coupled to the bus DBUS, a second terminal coupled to the node VDDSA, and a gate coupled to a node DEPCn_L. The node DEPCn_L is set at "L" level when charging the bus DBUS.

With the above configuration, the sense amplifier unit SAU is provided with a latch circuit capable of holding data between the bit line BL and the bus XBUS and can function as a data transmission and reception path.

For example, the sequencer 25 transmits control signals to the nodes BLS, BLC, BLX, NLO, XXL, BLQ, DSW, and STB in the sense amplifier unit SAU, the nodes STI, SLI, STL, and SLL in the latch circuit SDL, the nodes XTI, XLI, XLL, XNL, and XTL in the latch circuit XDL, and the node DEPCn_L in the precharge circuit PC.

1.1.9 Configurations of Register and PB Address Comparator

The configurations of the register and the PB address comparator will be described with reference to FIG. 8. The following will exemplify the configurations of the register 24 and the PB address comparator 28, which correspond to the 16 planes PB. However, the configurations of the register 24 and the PB address comparator 28 can be changed in accordance with the number of planes PB.

As shown in FIG. 8, the register 24 includes sixteen latch circuit units 24_0 to 24_15 corresponding to the plane addresses PBADD of the planes PB0 to PB15. The latch circuit units 24_0 to 24_15 have the same arrangements.

Each of the latch circuit units 24_0 to 24_15 includes three latch circuits DIL, ACL, and SPL.

The latch circuit DIL latches information about the plane address PBADD of a command set corresponding to a write operation and input from the memory controller 10. For example, when the plane address PBADD of a command set corresponding to a write operation and received from the memory controller 10 corresponds to the plane PB0, a signal CSA0 input to the latch circuit DIL of the latch circuit unit 24_0 is set at "H" level, and signals CSA1 to CSA15 input to the latch circuits DIL of the remaining latch circuit units 24_1 to 24_15 are set at "L" level. As a result, an output signal DIL_PB0 from the latch circuit DIL of the latch circuit unit 24_0 is set at "H" level, and output signals DIL_PB1 to DIL_PB15 from the latch circuits DIL of the remaining latch circuit units 24_1 to 24_15 are set at "L" level. The signals DIL_PB0 to DIL_PB15 each are a signal indicating whether the plane address PBADD of a command set corresponding to a write operation and received from the memory controller 10 indicates the corresponding plane PB. In the following description, when a specific plane PB is not specified, the signal is simply written as a signal DIL_PB.

The latch circuit ACL latches information about the plane PB in which a write operation is being executed. When, for example, a write operation is being executed in the plane PB0, an input signal CSB0 input to the latch circuit ACL in the latch circuit unit 24_0 is set at "H" level, and signals CSB1 to CSB15 input to the latch circuits ACL in the remaining latch circuit units 24_1 to 24_15 are set at "L" level. As a result, an output signal ACL_PB0 from the latch circuit ACL in the latch circuit unit 24_0 is set at "H" level, and output signals ACL_PB1 to ACL_PB15 from the latch circuits ACL in the remaining latch circuit units 24_1 to 24_15 are set at "L" level. The signals ACL_PB0 to ACL_PB15 each are a signal indicating whether a write operation is being executed in the corresponding plane PB. In the following description, when a specific plane PB is not specified, the signal is simply written as a signal ACL_PB.

The latch circuit SPL latches information about the plane address PBADD in which a write operation is suspended and a read operation is executed. When, for example, a read operation is to be executed in the plane PB0 after a write operation is suspended, an input signal CSC0 input to the latch circuit ACL in the latch circuit unit 24_0 is set at "H" level, and the signals CSB1 to CSB15 input to the latch circuits SPL of the remaining latch circuit units 24_1 to 24_15 are set at "L" level. As a result, an output signal SPL_PB0 from the latch circuit SPL of the latch circuit unit 24_0 is set at "H" level, and output signals SPL_PB1 to SPL_PB15 from the latch circuits SPL of the remaining latch circuit units 24_1 to 24_15 are set at "L" level. The signals SPL_PB0 to SPL_PB15 each are a signal indicating the plane PB in which a write operation is suspended and a read operation is executed. In the following description, when a specific plane PB is not specified, the signal is simply written as a signal SPL_PB.

The PB address comparator 28 will be described next.

The PB address comparator 28 includes sixteen logical circuit units 51_0 to 51_15 corresponding to the planes PB0 to PB15 and an OR circuit 52. Although the configuration of the logical circuit unit 15_0 will be described in detail below, the logical circuit units 51_0 to 51_15 have the same configurations.

Each of the logical circuit units 51_0 to 51_15 includes an OR circuit 53 and an AND circuit 54.

In the logical circuit unit 51_0, the signal DIL_PB0 is input to the first input terminal of the OR circuit 53, and the signal ACL_PB0 is input to the second input terminal. The output terminal of the OR circuit 53 is coupled to the first input terminal of the AND circuit 54. For example, when either the signal DIL_PB0 or ACL_PB0 is set at "H" level, the OR circuit 53 outputs an "H"-level signal.

The signal SPL_PB0 is input to the second input terminal of the AND circuit 54, and the OR circuit 52 is coupled to the output terminal. For example, when an output signal from the OR circuit 53 and the signal SPL_PB0 are at "H" level, the AND circuit 54 outputs an "H"-level signal. That is, when the plane PB in which an operation under execution is suspended and a read operation is executed matches the plane PB that has suspended an operation or the plane PB corresponding to an instruction received from the memory controller 10, the AND circuit 54 outputs an "H"-level signal.

The OR circuit 52 includes 16 input terminals corresponding to the logical circuit units 51_0 to 51_15. When, for example, any one of the logical circuit units 51_0 to 51_15 outputs an "H"-level signal, the OR circuit 52 sets an output signal MTCH at "H" level. That is, the signal MTCH is set at "H" level when the plane PB corresponding to a write instruction or the plane PB that suspends a write operation or the like matches the plane PB that executes a read operation after suspension.

1.2 Read Operation

A read operation will be described next. In this embodiment, a read operation includes three operation modes, namely a "normal read operation", "first suspend read operation", and "second suspend read operation".

A normal read operation is an operation mode selected in an ordinary read operation without a suspend operation. The first suspend read operation is an operation mode selected when the plane PB that suspends a write operation matches the plane PB as a read target. The second suspend read operation is an operation mode selected when the plane PB that suspends a write operation differs from the plane PB as a read target.

1.2.1 Data Transfer in Sense Amplifier Unit

Data transfer in the sense amplifier unit involved in the execution of a read operation will be described first with reference to FIG. 9. In this embodiment, a data transfer operation in the sense amplifier unit SAU during execution of a read operation differs between in a first suspend read operation and in a second suspend read operation.

The following is a case of the first suspend read operation, that is, a case in which the plane PB that suspends a write operation matches the plane PB as a read target.

Figure 9:
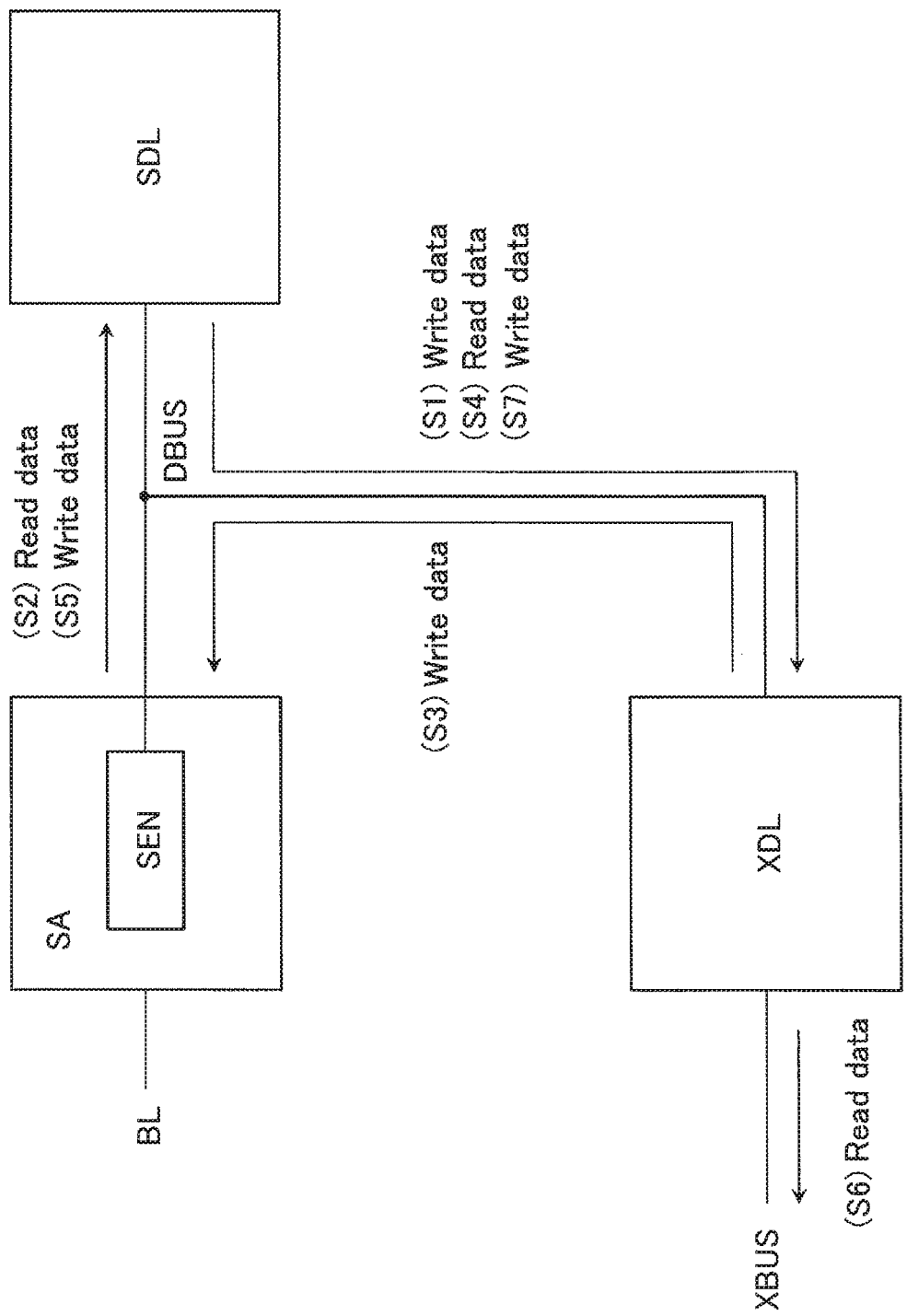
FIG. 9 is a schematic view for explaining data transfer in a sense amplifier unit in the semiconductor memory device according to the first embodiment.

As shown in FIG. 9, in step S1, the sequencer 25 causes the latch circuit XDL to hold write data in the latch circuit SDL.

Subsequently, in step S2, the sequencer 25 senses the threshold voltage of the memory cell transistor MT as a read target at the node SEN and causes the latch circuit SDL to hold the data sensed at the node SEN (the inverted data of the read data).

In step S3, the sequencer 25 causes the node SEN in the sense amplifier SA to hold the inverted data of the write data held in the latch circuit XDL.

In step S4, the sequencer 25 causes the latch circuit XDL to hold the inverted data (read data) of the read data held in the latch circuit SDL.

In step S5, the sequencer 25 causes the latch circuit SDL to hold the inverted data of the data held in the node SEN, that is, the write data.

In step S6, the sequencer 25 outputs the read data transferred to the latch circuit XDL to the memory controller 10.

In step S7, the sequencer 25 causes the latch circuit XDL to hold the inverted data of the write data held in the latch circuit SDL.

With the above operation, a data read operation can be executed without loosing write data even when the plane PB that has suspended a write operation matches the plane PB as a read target.

The next describes the second suspend read operation, that is, a case in which the plane PB that suspends a write operation differs from the plane PB as a read target. In this case, there is no need to consider the possibility of collision between write data and read data in the latch circuit XDL. Accordingly, the sequencer 25 outputs read data to the memory controller 10 in accordance with a sequence with omission of steps S3, S5, and S7 in the example shown in FIG. 9, i.e., sequence of steps S1, S2, S4, and S6.

When performing a normal read operation, because there is no write data, the sequencer 25 outputs read data to the memory controller 10 in accordance with a sequence with omission of steps S1, S3, S5, and S7, i.e., a sequence of steps S2, S4, and S6.

In the following description, a transfer operation for a series of data in steps S3 to S5 in the first suspend read operation is written as a scan SS. The transfer operation for data from the latch circuit SDL to the latch circuit XDL in each of steps S1 and S4 (second suspend read operation) is written as a scan S2X. The transfer operation for inverted data from the latch circuit SDL to the latch circuit XDL in step S7 is written as a scan /S2X. Note that in each data transfer, the data held in a latch circuit (or the node SEN) may be transferred or inverted data may be transferred.

1.2.2 Flowchart of Read Operation

A read operation will be described next with reference to the flowchart of FIG. 10. FIG. 10 is a flowchart showing an example of operation mode selection in a read operation in the semiconductor memory device according to the first embodiment.

As shown in FIG. 10, first of all, the semiconductor memory device 20 receives a read instruction from the memory controller 10 (step 810).

When, for example, a write operation is not suspended (No in step S1), the sequencer 25 executes a normal read operation (step S14).

When a write operation is suspended (Yes in step S11), the sequencer 25 causes the PB address comparator 28 to compare the plane PB under execution of the write operation with the plane PB as a read target.

When the plane PB under execution of the write operation matches the read-target plane PB (Yes in step S13), the sequencer 25 executes the first suspend operation (step 815).

When the plane PB under execution of the write operation differs from the read-target plane PB (No in step 813), the sequencer 25 executes the second suspend read operation (step S16).

1.3 Specific Example of Read Operation

Specific examples of the first suspend read operation and the second suspend read operation will be described next.

1.3.1 Specific Example of First Suspend Read Operation

Figure 11:
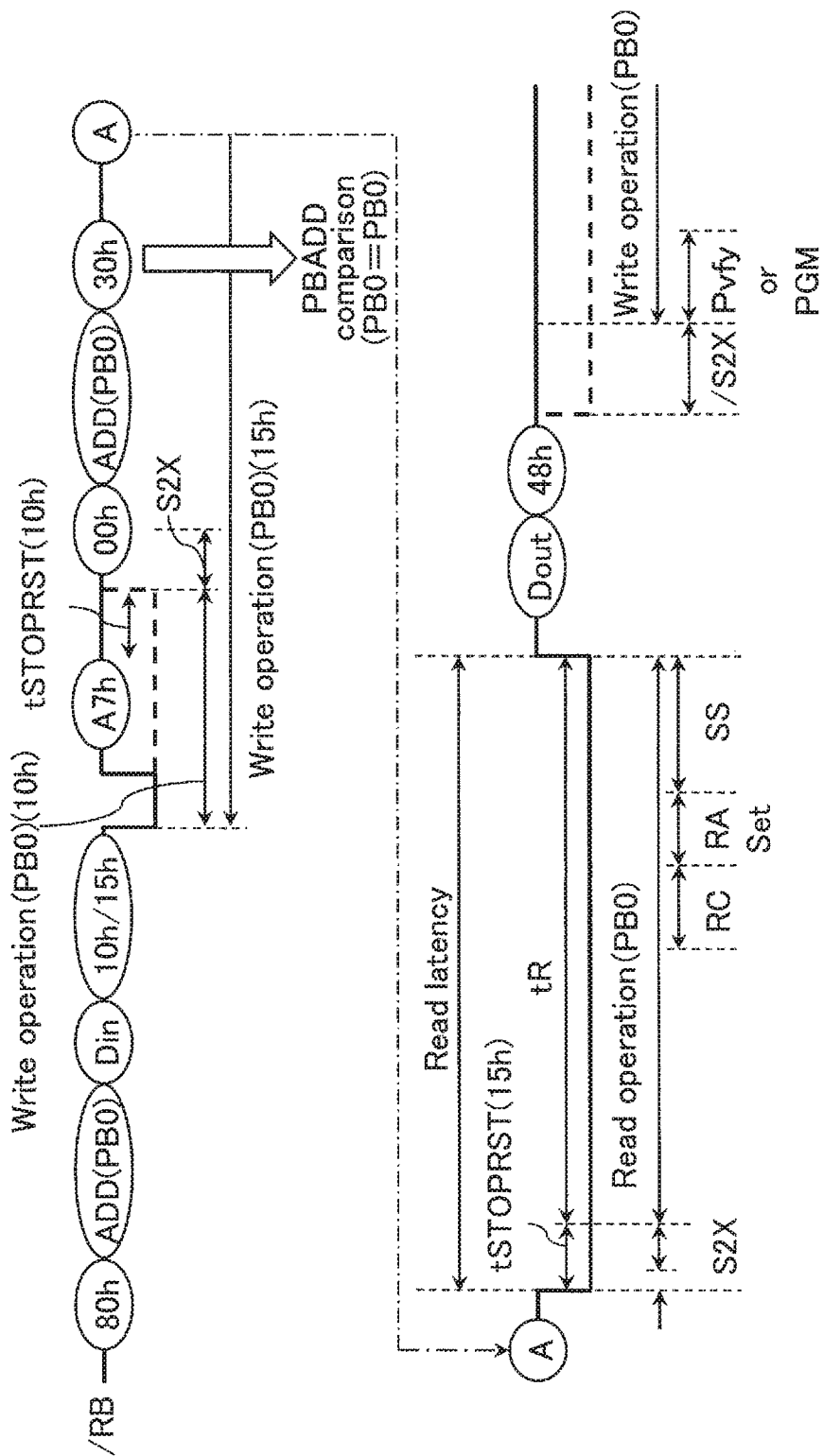
FIG. 11 is a timing chart showing a command sequence and a signal /RB when a first suspend read operation is executed in a plane PB0 after suspension of a write operation in the plane PB0 in the semiconductor memory device according to the first embodiment.

A specific example of the first suspend read operation will be described first with reference to FIG. 11. FIG. 11 is a timing chart showing, as an example of the first suspend read operation, a command sequence and the signal /RB in a case in which a write operation in the plane PB0 is suspended, and the first suspend read operation is executed in the plane PB0.

Note that write operations in this embodiment include two operation modes, namely a normal program operation and a cache program operation.

The normal program operation is an operation mode of maintaining the signal /RB at "L" level (busy state) during a period from time when the latch circuit XDL latches write data to time when the write operation is terminated.

The cache program operation is an operation mode of maintaining the signal /RB at "L" level (busy state) during a period from time when the latch circuit XDL latches write data to time when the latched data is transferred to another latch circuit (for example, the latch circuit SDL). In the cache program operation, when, for example, a plane PB under execution of a write operation differs from a plane PB as a next write operation target, next write-operation data can be input to the latch circuit XDL of the plane PB as the next write operation target concurrently with the write operation.

As shown in FIG. 11, the memory controller 10 issues a command "80h" and transmits it to the semiconductor memory device 20 when no write command or the like is transmitted immediately before the operation and the semiconductor memory device 20 is in the ready state. The command "80h" is a command for instructing to perform a data write operation on the semiconductor memory device 20.

The memory controller 10 then issues the address ADD and transmits it to the semiconductor memory device 20. The address ADD specifies, for example, a write-target plane PB, a block BLK, and the address of a particular area in the block BLK. In the case shown in FIG. 11, the sequencer 25 uses the address ADD to specify the address of the area, in the plane PB0, in which data is written. Once the address ADD is stored in the register 24, for example, the sequencer 25 releases the latch circuits XDL in all the planes PB (for example, resets the data held in all the latch circuits XDL to "1"). This can prevent the occurrence of an unexpected write operation in the subsequent write operation. Note that the address ADD can have any number of cycles.

The memory controller 10 then transmits write data Din to the semiconductor memory device 20. Subsequently, the memory controller 10 issues, for example, a command "10h" or "15h" and transmits it to the semiconductor memory device 20. The command "10h" is a command for the execution of a normal program operation. The command "15h" is a command for the execution of a cache program operation.

Once the command "10h" or "15h" is stored in the register 24, the logic controller 23 sets the signal /RB at "L" to inform the memory controller 10 that the semiconductor memory device 20 is in the busy state. The sequencer 25 inputs the write data Din transmitted from the memory controller 10 in the corresponding latch circuit XDL in the plane PB0. The sequencer 25 then causes the latch circuit XDL to transfer the write data Din to another latch circuit (for example, the latch circuit SDL) in the plane PB0. Subsequently, the sequencer 25 starts a write operation by controlling the voltage generator 26 and the row decoder 21_2, the sense amplifier module 21_3, and the like in the plane PB0 in the core unit 21.

For example, upon reception of the command "15h", the logic controller 23 sets the signal /RB at "H" level when the transfer of data from the latch circuit XDL to another latch circuit is terminated. Upon reception of the command "10h", the logic controller 23 maintains the signal /RB at "L" level during a write operation.

The write operation includes a program operation and a verify operation. The program operation is the operation of increasing the threshold voltage of the memory cell transistor MT based on the write data Din. The verify operation is the operation of sensing the threshold voltage of the memory cell transistor MT after the program operation and determining whether the threshold voltage of the memory cell transistor MT has increased to a desired value. The sequencer 25 repeatedly executes a program cycle including a program operation and a verify operation, and thereby finally completes the write operation. Note that as a program cycle is executed, the write data Din is updated in accordance with, for example, a verify operation result. In the following description, assume that the "write data Din" includes not only the write data transmitted from the memory controller 10 to the semiconductor memory device 20 but also the write data updated in accordance with how much the write operation described above has progressed.

The memory controller 10 receives an instruction to execute a read operation with high priority in the plane PB0 from an external host device. With this reception, the memory controller 10 issues a command "A7h", and transmits the command to the semiconductor memory device 20. The command "A7h" is a command for informing the semiconductor memory device 20 that a write operation under execution is suspended, and an operation interrupt is generated.

For the case where a normal program operation is being executed based on the command "10h", upon receiving the command "A7h", the sequencer 25 suspends the write operation at the timing when a program operation or verify operation is terminated. Subsequently, the logic controller 23 sets the signal /RB at "H" level (the signal /RB indicated by the broken line in FIG. 11). Accordingly, when a normal program operation is being executed, a standby period tSTOPRST occurs until the logic controller 23 sets the signal /RB at "H" level, i.e., a read operation comes to be able to be received after the semiconductor memory device 20 receives the command "A7h". After the standby period tSTOPRST ends and the signal /RB returns to "H" level, the sequencer 25 executes a scan S2X. During execution of the scan S2X, because the signal /RB has already returned to "H" level, the semiconductor memory device 20 can receive a command "00h" (to be described later) concurrently with the scan S2X. In contrast to this, during execution of a cache program operation based on a command "15h", the signal /RB is set at "H" level before the command "A7h" is received. Accordingly, the standby period tSTOPRST is not provided after the command "A7h" is received, and the standby period tSTOPRST occurs after a command "30h" (to be described later) is received.

Subsequently, upon determining that the signal /RB is at "H" level, the memory controller 10 issues the command "00h" and transmits it to the semiconductor memory device 20. The command "00h" is a command for instructing a data read operation from the semiconductor memory device 20.

The memory controller 10 then issues the address ADD and transmits it to the semiconductor memory device 20. The address ADD specifies, for example, the read-target plane PB (the plane PB0 in this case), the block BLK, and the address of a particular area in the block BLK. In this case, the address ADD can specify any block BLK in any plane PB, not limited to the plane PB0 under execution of a write operation.

The memory controller 10 issues the command "30h" and transmits it to the semiconductor memory device 20. The command "30h" is a command for the execution of a data read operation from the semiconductor memory device 20 based on the address ADD transmitted immediately before the command. For the case where a cache program operation is being executed, upon receiving the command "30h", the semiconductor memory device 20 starts the operation of suspending a write operation and generating a read operation interrupt.

More specifically, the PB address comparator 28 compares the plane PB0 under execution of a write operation with the read-target plane PB0. In the case shown in FIG. 11, because the plane PB under execution of the write operation matches the read-target plane PB, the PB address comparator 28 sets the signal MTCH at "H" level. The sequencer 25 selects the first suspend read operation based on the "H"-level signal MTCH.

The logic controller 23 sets the signal /RB at "L" level.

First of all, the sequencer 25 executes the scan S2X to transfer the write data Din held in the latch circuit SDL of the plane PB0 to the latch circuit XDL.

For the case where a cache program operation based on the command "15h" is being executed, upon receiving the command "30h", the sequencer 25 suspends the cache program operation at the timing when a program operation or verify operation is terminated. Subsequently, the sequencer 25 executes the scan S2X. Accordingly, when a cache program operation is being executed, the standby period tSTOPRST occurs for a period from time when the signal /RB is set at "L" level to time when a read operation can be actually executed. In contrast to this, in a normal program operation based on the command "10h", the standby period tSTOPRST for the suspension of a write operation occurs for a period from time when the command "A7h" is received to time when reception of the command "00h". The scan S2X is executed after the end of the standby period tSTOPRST. For this reason, after the signal /RB is set at "L" level, the standby period tSTOPRST is not provided, and the scan S2X is not executed.

When the read operation becomes executable, the sequencer 25 starts the first suspend read operation.

More specifically, first of all, the sequencer 25 reads data from the memory cell transistor MT.

The sequencer 25 stores the data (the inverted data of read data Dout) sensed at the node SEN in a period RC in the latch circuit SDL, and initializes the voltages applied to interconnects in the plane PB0.

In order to resume the write operation, the sequencer 25 executes a setting operation RA_Set, which refers to as setting a row address RA corresponding to the write operation in the row decoder 21_2 in the plane PB as a write target (the plane PB0 in this case).

In the first suspend read operation, the sequencer 25 executes a scan SS described with reference to FIG. 9. More specifically, in the plane PB0, the sequencer 25 transfers the inverted data of the write data Din held in the latch circuit XDL to the node SEN, and then transfers the inverted data (read data Dout) of the data held in the latch circuit SDL to the latch circuit XDL. In addition, in the plane PB0, the sequencer 25 transfers the inverted data of the data (that is, the write data Din) held in the node SEN to the latch circuit SDL.

This completes the first suspend read operation, and the logic controller 23 sets the signal /RB at "H" level to inform the memory controller 10 that the semiconductor memory device 20 is in the ready state.

In the following description, the period from time when a read operation starts to time when the signal /RB is set at "H" level is written as a period tR. In addition, the combined period of the standby period tSTOPRST and the period tR is written as a read latency.

When the semiconductor memory device 20 enters the ready state (the signal /RB is set at "H" level), the memory controller 10 repeatedly asserts the signal /RE. Every time the signal /RE is toggled, the read data Dout is output to the memory controller 10.

After the read data Dout is completely output to the memory controller 10, the memory controller 10 issues a command "48h" and transmits it to the semiconductor memory device 20. The command "48h" is a command for informing the semiconductor memory device 20 that the suspended write operation is resumed. Upon receiving the command "48h", the sequencer 25 resumes a write operation for the plane PB0.

More specifically, for resuming a normal program operation, the logic controller 23 sets the signal /RB at "L" level. For resuming a cache program operation, the logic controller 23 maintains the signal /RB at "H" level. In a cache program operation, the semiconductor memory device 20 remains in the ready state, and the memory controller 10 can recognize that the semiconductor memory device 20 is ready for further receiving a command.

First of all, the sequencer 25 executes a scan /S2X, and transfers the inverted data of the write data Din held in the latch circuit SDL to the latch circuit XDL.

The sequencer 25 then resumes the write operation for the plane PB0 from a verify operation Pvfy or a program operation PGM.

1.3.1 Specific Example of Second Suspend Read Operation

Figure 12:
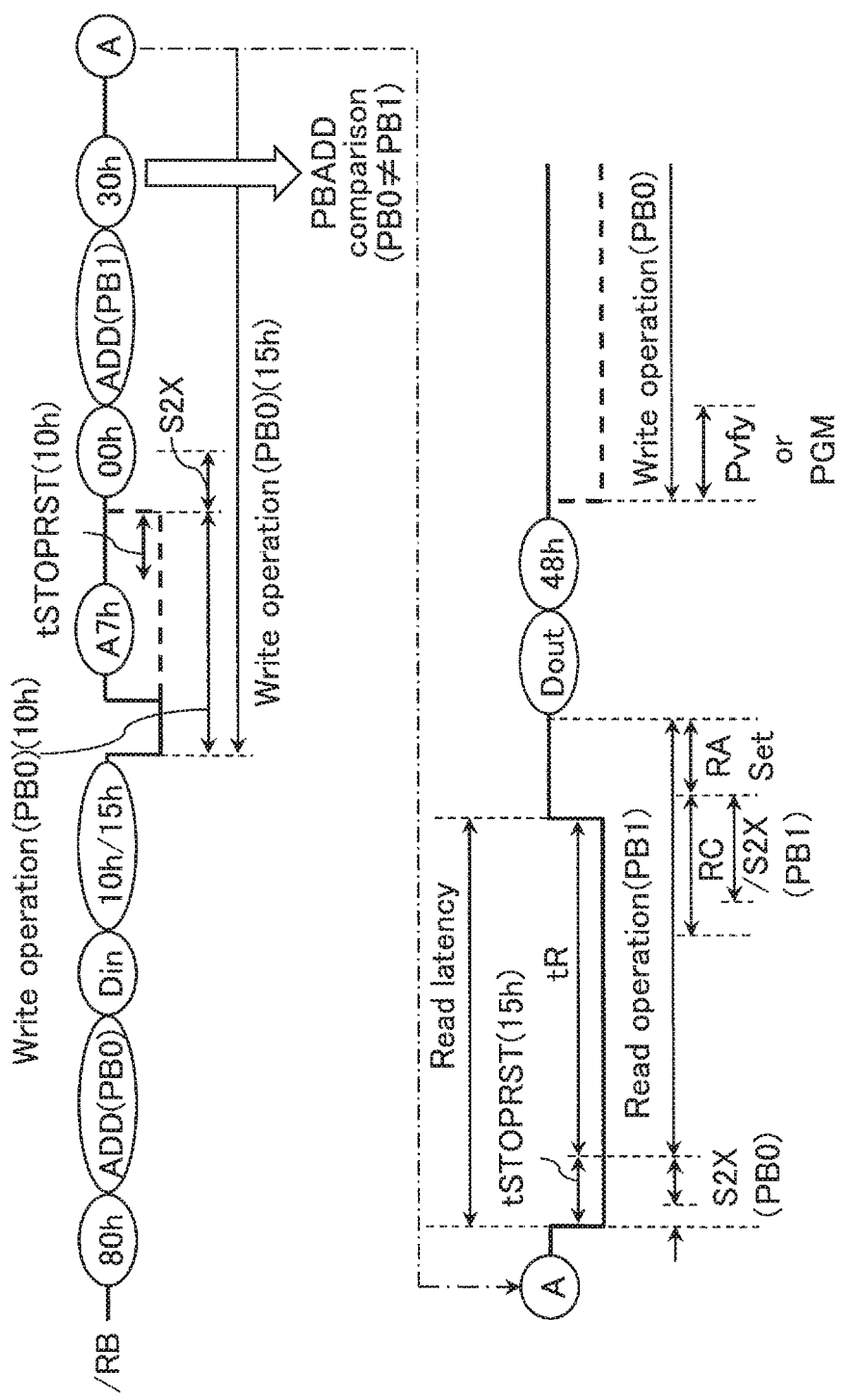
FIG. 12 is a timing chart showing a command sequence and the signal /RB when a second suspend read operation is executed in a plane PB1 after suspension of a write operation in the plane PB0 in the semiconductor memory device according to the first embodiment.

A specific example of the second suspend read operation will be described next with reference to FIG. 12. FIG. 12 is a timing chart showing, as an example of the second suspend read operation, a command sequence and the signal /RB in a case in which a write operation in the plane PB0 is suspended, and the second suspend read operation is executed in the plane PB1. This operation will be described below, mainly focusing on differences from FIG. 11.

As shown in FIG. 12, as in the case shown in FIG. 11, first of all, the memory controller 10 transmits, to the semiconductor memory device 20, a command set (a command "80h", the address ADD (PB0), the write data Din, and command "10h" or "15h") corresponding to the write operation in the plane PB0.

The memory controller 10 transmits the command "A7h" to the semiconductor memory device 20. Upon determining that the signal /RB is at "H" level, the memory controller 10 transmits a command set (the command "00h", address ADD (plane PB1), and command "30h") for a read operation in the plane PB1 to the semiconductor memory device 20.

The semiconductor memory device 20 starts the operation of generating a read operation interrupt.

More specifically, the PB address comparator 28 compares the plane PB0 under execution of a write operation with the read-target plane PB1. In the case shown in FIG. 12, because the plane PB under execution of a write operation differs from the plane PB as a read target, the PB address comparator 28 sets the signal MTCH at "L" level. The sequencer 25 selects the second suspend read operation based on the "L"-level signal MTCH.

The logic controller 23 sets the signal /RB at "L" level.

First of all, the sequencer 25 executes the scan S2X and transfers the write data Din held in the latch circuit SDL of the plane PB0 to the latch circuit XDL.

When the read operation in the plane PB1 becomes executable, the sequencer 25 starts the second suspend read operation.

More specifically, first of all, the sequencer 25 reads data from the memory cell transistor MT of the plane PB1.

In the period RC, the sequencer 25 stores the read data Dout read in the plane PB1 in the latch circuit SDL and initializes the voltages applied to interconnects in the plane PB1.

Concurrently with the operation in the period RC, the sequencer 25 executes the scan /S2X in the plane PB1, and transfers the inverted data (read data Dout) of the data in the latch circuit SDL to the latch circuit XDL.

In order to resume the write operation, for example, the sequencer 25 executes the setting operation RA_Set of setting the row address RA corresponding to the write operation in the row decoder 21_2 in the write-target plane PB0. This completes the second suspend read operation.

In order to shorten the period from the end of the setting operation RA_Set of the row address RA to the start of the output operation of the read data Dout, the logic controller 23 sets the signal /RB at "H" level earlier than the timing of the end of the setting operation RA_Set of the row address RA by a period during which a command required for a data output operation is input.

The memory controller 10 repeatedly asserts the signal /RE once the semiconductor memory device 20 enters the ready state. Every time the signal /RE is toggled, the read data Dout is output to the memory controller 10.

The subsequent operation is the same as that shown in FIG. 11. In the first suspend read operation shown in FIG. 11, a plane under execution of a write operation matches a read-target plane. Accordingly, the write data Din saved from the latch circuit SDL into the latch circuit XDL after the suspension of a write operation in the plane PB0 is updated into the read data Dout as a result of the read operation. In resuming the write operation, therefore, the scan /S2X is executed to update the data stored in the latch circuit XDL into the write data Din. However, in the second suspend read operation shown in FIG. 12, a plane under execution of a write operation differs from a read-target plane. For this reason, the read operation in the plane PB1 has no damage to the write data Din saved from the latch circuit SDL into the latch circuit XDL after the suspension of the write operation in the plane PB0. Therefore, when the write operation is resumed, the scan /S2X is not executed.

1.4 Specific Examples of Operations of Register and PB Address Comparator

Specific examples of the operations of the register 24 and the PB address comparator 28 related to a read operation will be described next.

Figure 13:
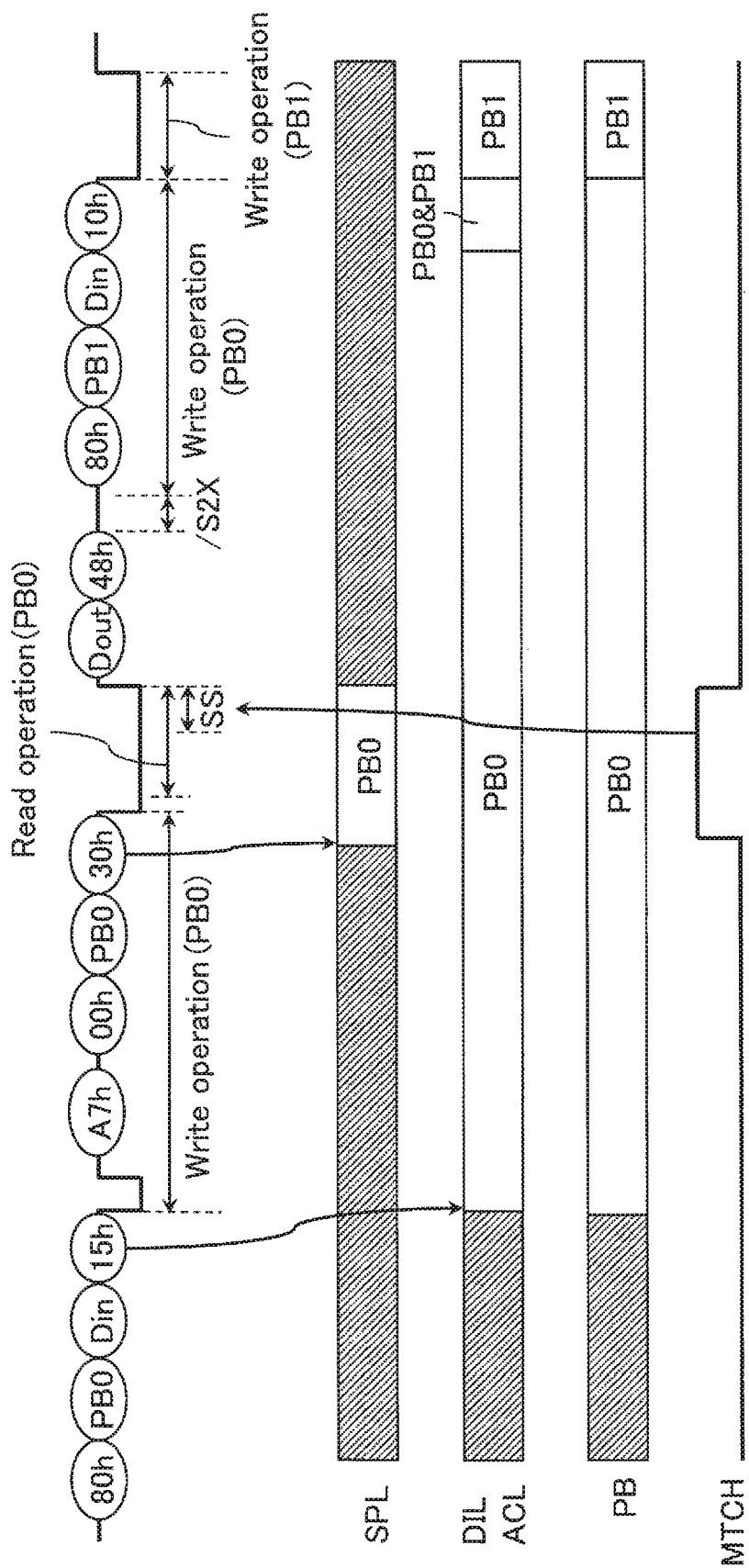
FIG. 13 shows an example of a command sequence related to the first suspend read operation and an example of a timing chart of various signals in the semiconductor memory device according to the first embodiment.

1.4.1 Specific Examples of Operations of Register and PB Address Comparator Related to First Suspend Read Operation Specific examples of the operations of the register and the PB address comparator related to the first suspend read operation will be described first with reference to FIG. 13. FIG. 13 shows an example of a command sequence related to the first suspend read operation and an example of a timing chart of various signals.

As shown in FIG. 13, first of all, the memory controller 10 transmits, for example, a command set (the command "80h", address ADD (PB0), data "Din", and command "15h") corresponding to a cache program operation in the plane PB0 to the semiconductor memory device 20.

When the command "15h" is received, in the register 24, the latch circuits DIL and ACL in the latch circuit unit 24_0 corresponding to the plane PB0 latch "H" level. More specifically, when the address ADD (PB0) is received, the signal CSA0 is set at "H" level, and the corresponding latch circuit DIL latches an "H"-level signal CSA0. As a result, the latch circuit DIL sets the output signal DIL_PB0 at "H" level. In addition, when no other operation is being executed, because a cache program operation in the plane PB0 is executed, the signal CSB0 is set at "H" level, and the corresponding latch circuit ACL latches the "H"-level signal CSB0. As a result, the latch circuit ACL sets the output signal ACL_PB0 at "H" level.

When the command "15h" is received, the logic controller 23 sets the signal /RB at "L" level. The sequencer 25 starts a cache program operation in the plane PB0, which brings the plane PB0 into an operation state. For example, the latch circuit XDL in the plane PB0 to be set in the operation state is released in a pseudo manner. More specifically, the sequencer 25 regards the latch circuits XDL in all the planes PB as being unused without resetting the data held in the latch circuit XDL in the plane PB0.

Upon completely transferring data from the latch circuit XDL to the latch circuit SDL, the logic controller 23 sets the signal /RB at "H" level.

Upon determining that the signal /RB is at "H" level, the memory controller 10 transmits the command "A7h" and a command set (the command "00h", address ADD (PB0), and command "30h") corresponding to a read operation in the plane PB0 to the semiconductor memory device 20.

Upon reception of the command "30h", the latch circuit SPL in the latch circuit unit 24_0 latches "H" level in accordance with the command "A7h" and the command set corresponding to the read operation. More specifically, the signal CSC0 is set at "H" level, and the corresponding latch circuit SPL latches the "H"-level signal CSC0. As a result, the latch circuit SPL sets the output signal SPL_PB0 at "H" level.

The PB address comparator 28 sets the signal MTCH at "H" level in accordance with the "H"-level signals DIL_PB0, ACL_PB0, and SPL_PB0. More specifically, because the signals DIL_PB0, ACL_PB0, and SPL_PB0 are at "H" level, the AND circuit 54 in the logical circuit unit 51_0 in the PB address comparator 28 outputs an "H"-level signal. As a result, the output signal MTCH from the OR circuit 52 is set at "H" level.

Upon receiving the command "30h", the logic controller 23 sets the signal /RB at "L" level. Subsequently, the sequencer 25 executes the first suspend read operation in accordance with the "H"-level signal MTCH.

When the first suspend read operation is complete, the latch circuit SPL in the latch circuit unit 24_0 latches "L"

level. More specifically, the signal CSC0 is set at "L" level. The corresponding latch circuit SPL latches the "L"-level signal CSC0, and sets the output signal SPL_PB0 at "L" level. As a result, the signal MTCH is set at "L" level.

When the first suspend read operation is complete, the logic controller 23 sets the signal /RB at "H" level.

Upon receiving the command "48h" after outputting the read data Dout, the semiconductor memory device 20 resumes a cache program operation in the plane PB0 after the execution of the scan /S2X.

For example, during the execution of the cache program operation in the plane PB0, the semiconductor memory device 20 receives a command set (the command "80h", address ADD (PB1), data "Din", and command "10h") corresponding to a normal program operation in the plane PB1 from the memory controller 10.

When the command "10h" is received, the latch circuits DIL and ACL in the latch circuit unit 24_1 corresponding to the plane PB1 latch "H" level. With this operation, the latch circuits DIL and ACL in the latch circuit units 24_0 and 24_1 latch "H" level in accordance with the planes PB0 and PB1.

When the cache program operation in the plane PB0 is complete, the logic controller 23 sets the signal /RB at "L" level. The sequencer 25 then starts a normal program operation in the plane PB1. In the register 24, the latch circuits DIL and ACL in the latch circuit unit 24_0 latch "L" level, and the latch circuits DIL and ACL in the latch circuit unit 24_1 latch "H" level.

When the normal program operation in the plane PB1 is complete, the logic controller 23 sets the signal /RB at "H" level.

1.4.2 Specific Examples of Operations of Register and PB Address Comparator Related to Second Suspend Read Operation Specific examples of the operations of the register and the PB address comparator related to the second suspend read operation will be described next with reference to FIG. 14. FIG. 14 shows an example of a command sequence related to the second suspend read operation and an example of a timing chart of various signals. This operation will be described below, mainly focusing on differences from FIG. 13.

As shown in FIG. 14, the semiconductor memory device 20 receives a command set corresponding to a cache program operation in the plane PB0, and then the command "A7h" and a command set (the command "00h", address ADD (PB2), and command "30h") corresponding to a read operation in the plane PB2.

When the command "30h", the latch circuit SPL in the latch circuit unit 24_2 corresponding to the plane PB2 latches "H" level. More specifically, the signal CSC2 is set at "H" level, and the corresponding latch circuit SPL latches the "H"-level signal CSC2. As a result, the latch circuit SPL sets the output signal SPL_PB2 at "H" level.

The PB address comparator 28 outputs the "L"-level signal MTCH in accordance with the "H"-level signals DIL_PB0, ACL_PB0, and SPL_PB2. More specifically, in the logical circuit unit 51_0 in the PB address comparator 28, because the signals DIL_PB0 and ACL_PB0 are at "H" level and the signal SPL_PB0 is at "L" level, the AND circuit 54 outputs an "L"-level signal. In addition, in the logical circuit unit 51_2, because the signals DIL_PB2 and ACL_PB2 are at "L" level and the signal SPL_PB2 is at "H" level, the AND circuit 54 outputs an "L"-level signal. As a result, the signal MTCH from the OR circuit 52 is set at "L" level.

Upon receiving the command "30h", the logic controller 23 sets the signal /RB at "L" level. The sequencer 25 then executes the second suspend read operation in accordance with the "L"-level signal MTCH.

When the second suspend read operation is complete, the logic controller 23 sets the signal /RB at "H" level. The latch circuit SPL in the latch circuit unit 24_2 latches "L" level. More specifically, the signal CSC2 is set at "L" level, and the latch circuit SPL latches the "L"-level signal CSC2. As a result, the latch circuit SPL sets the output signal SPL_PB2 at "L" level.

Upon receiving the command "48h" after outputting the read data Dout, the semiconductor memory device 20 resumes a cache program operation in the plane PB0. The subsequent operation is the same as that shown in FIG. 13.

1.5 Advantageous Effects According to Embodiment

The configuration according to this embodiment can provide a semiconductor memory device that can improve the processing capability. The advantageous effects of the embodiment will be described in detail below.

The semiconductor memory device 20 includes the PB address comparator that, when suspending a write operation and executing a read operation, compares the plane PB for which a write instruction has been received or the plane PB under execution of the write operation with the read-target plane PB. The semiconductor memory device 20 can execute different read operations depending on whether the plane PB for which the write instruction has been received or the plane PB under execution of the write operation matches or differs from the read-target plane PB.

More specifically, when the plane PB for which the write instruction has been received or the plane PB under execution of the write operation matches the read-target plane PB, the semiconductor memory device 20 can read data while saving the write data held in the latch circuit XDL into another latch circuit (for example, the latch circuit SDL). In contrast to this, when the plane PB for which the write instruction has been received or the plane PB under execution of the write operation differs from the read-target plane PB, the semiconductor memory device 20 can read data without saving the write data held in the latch circuit XDL.

In addition, when the plane PB for which the write instruction has been received or the plane PB under execution of the write operation differs from the read-target plane PB, the semiconductor memory device 20 can execute the scan S2X of transferring the data held in the latch circuit SDL to the latch circuit XDL concurrently with the read operation. Accordingly, when the plane PB for which the write instruction has been received or the plane PB under execution of the write operation differs from the read-target plane PB, the semiconductor memory device 20 can suppress an increase in read latency in a read operation. This can improve the processing capability of the semiconductor memory device 20.

Furthermore, the configuration according to this embodiment can set the signal /RB at "H" level before the end of the setting operation RA_Set of the row address RA corresponding to a write operation when the plane PB under execution of a write operation differs from the read-target plane PB. This can shorten the read latency and the interval from the end of a read operation to the output of data.

2. Second Embodiment

The second embodiment will be described next. The second embodiment will describe a specific example of a case in which a plurality of planes PB suspend synchronous write operations and execute read operations. This operation will be described below, mainly focusing on differences from the first embodiment.

2.1 Specific Example of Read Operation

Specific examples of the first suspend read operation and the second suspend read operation will be described first.

2.1.1 Specific Example of First Suspend Read Operation

Figure 15:
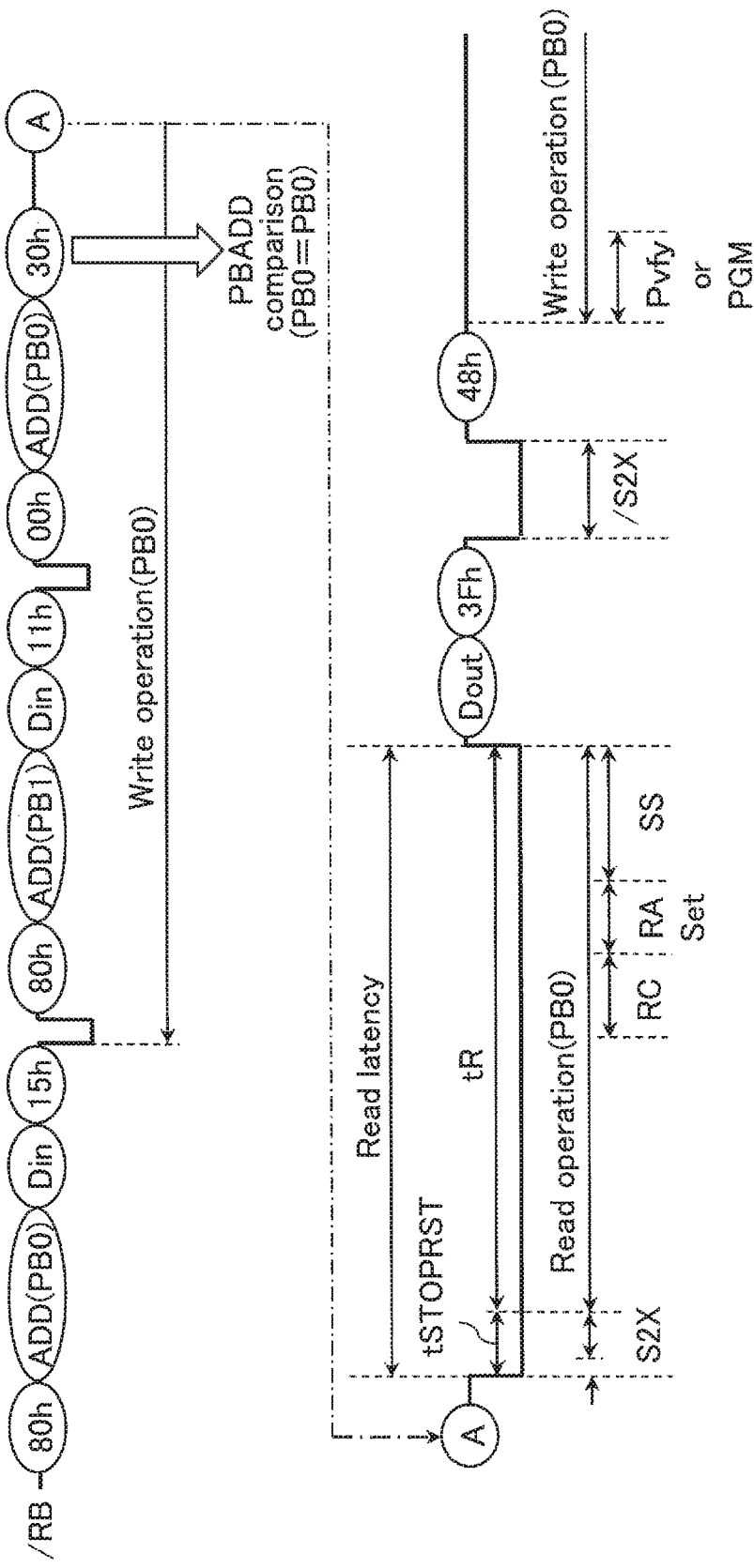
FIG. 15 is a timing chart showing a command sequence and a signal /RB when a first suspend read operation is executed in a plane PB0 after suspension of synchronous write operations in a plurality of planes PB in a semiconductor memory device according to the second embodiment.

A specific example of the first suspend read operation will be described with reference to FIG. 15. FIG. 15 is a timing chart showing a command sequence and the signal /RB when the first suspend read operation is executed in a plane PB0 after suspension of synchronous write operations in a plurality of planes PB.

As shown in FIG. 15, first of all, a memory controller 10 transmits, for example, a command set (a command "80h", address ADD (PB0), data "Din", and command "15h") corresponding to a cache program operation in the plane PB0 to a semiconductor memory device 20.

Upon receiving the command "15h", a sequencer 25 starts a cache program operation. A logic controller 23 keeps a signal /RB at "L" level during the period from time when the sequencer 25 starts a cache program operation to time when the write data Din is transferred to a latch circuit SDL in the plane PB0.

Upon determining that the signal /RB is at "H" level, the memory controller 10 transmits, for example, a command set (the command "80h", an address ADD (PB1), the write data "Din", and a command "11h") corresponding to a write operation in a plane PB1 to the semiconductor memory device 20 to cause a plurality of planes PB to synchronously execute write operations. The command "11h" is a command for informing the semiconductor memory device 20 that a plurality of planes PB synchronously execute operations. When the command "11h" is stored in a register 24, the logic controller 23 sets the signal /RB at "L" level. The sequencer 25 inputs the write data Din to a corresponding latch circuit XDL in the plane PB1.

After the write data Din is input to the corresponding latch circuit XDL in the plane PB1, the logic controller 23 sets the signal /RB at "H" level. The sequencer 25 waits for a command for instructing a write operation that is to be synchronously executed with the plane PB1.

The memory controller 10 receives, for example, an instruction to execute a read operation with high priority in the plane PB0 from an external host device before the write data Din is completely input to the latch circuit XDL in the plane PB1. Based on this, the memory controller 10 transmits a command set (the command "00h", the address ADD (PB0), and command "30h") corresponding to a read operation in the plane PB0 to the semiconductor memory device 20. This causes the semiconductor memory device 20 to, for example, perform the operation of suspending the input of the write data Din to the latch circuit XDL and generating a read operation interrupt in the plane PB0.

More specifically, a PB address comparator 28 compares the plane PB0 under execution of the write operation, the plane PB1 corresponding to the write instruction (the command "80h", address ADD (PB1), write data "Din", and command "11h"), and the read-target plane PB0. Because the plane PB0 under execution of the write operation matches the read-target plane PB0, the PB address comparator 28 sets a signal MTCH at "H" level. The sequencer 25 selects the first suspend read operation based on the "H"-level signal MTCH.

The logic controller 23 sets the signal /RB at "L" level.

The sequencer 25 executes a scan S2X and transfers the write data Din held in the latch circuit SDL of the plane PB0 to the latch circuit XDL.

When the read operation becomes executable, the sequencer 25 starts the read operation (first suspend read operation) in the plane PB0. The details of the first suspend read operation are the same as those in the first embodiment in FIG. 11.

When the read operation is complete, the logic controller 23 sets the signal /RB at "H" level.

When the semiconductor memory device 20 enters the ready state, the memory controller 10 repeatedly asserts the signal /RE. Every time the signal /RE is toggled, read data Dout is output to the memory controller 10.

When the read operation is complete, the memory controller 10 transmits a command "3Fn" to the semiconductor memory device 20. The command "3Fh" is a command for transferring part of the write data Din held in the latch circuit SDL to the latch circuit XDL.

Upon receiving the command "3Fh", the logic controller 23 sets the signal /RB at "L" level. The sequencer 25 executes a scan /S2X to transfer the inverted data of the write data Din, which has been input before the read operation, from the latch circuit SDL to the latch circuit XDL. This can restore the state immediately before the occurrence of a read operation interrupt in the sense amplifier unit SAU.

Upon completion of the scan /S2X, the logic controller 23 sets signal /RB at "H" level.

Upon determining that the signal /RB is at "H" level, the memory controller 10 transmits the command "48h" to the semiconductor memory device 20. Upon receiving the command "48h", the sequencer 25 resumes a cache program operation in the plane PB0 and waits for a command for instructing a write operation that is to be synchronized with the plane PB1.

2.1.2 Specific Example of Second Suspend Read Operation

A specific example of the second suspend read operation will be described next with reference to FIG. 16. FIG. 16 is a timing chart showing a command sequence and the signal /RB when the second suspend read operation is executed in a plane PB2 after suspension of synchronous write operations in a plurality of planes PB. This operation will be described below, mainly focusing on differences from FIG. 15.

As shown in FIG. 16, as in the case shown in FIG. 15, the memory controller 10 transmits a command set (the command "80h", address ADD (PB1), write data "Din", and command "11h") corresponding to a write operation in the plane PB1 to the semiconductor memory device 20.

Subsequently, for example, the memory controller 10 receives an instruction to execute a read operation with high priority in the plane PB2 from an external host device before the write data Din is completely input to the latch circuit XDL in the plane PB1. Based on this, the memory controller 10 transmits a command set (the command "00h", the address ADD (PB2), and command "30h") corresponding to a read operation in the plane PB2 to the semiconductor memory device 20. This causes the semiconductor memory device 20 to start the operation of suspending the input of the write data Din to the latch circuit XDL and generating a read operation interrupt in the plane PB2.

More specifically, the PB address comparator 28 compares the plane PB0 under execution of the write operation, the plane PB1 corresponding to the write instruction (the command "80h", address ADD (PB1), write data "Din", and command "11h"), and the read-target plane PB2. Because the plane PB0 under execution of the write operation and the plane PB1 corresponding to the write instruction differ from the read-target plane PB2, the PB address comparator 28 sets the signal MTCH at "L" level. The sequencer 25 selects the second suspend read operation based on the "L"-level signal MTCH.

The logic controller 23 sets the signal /RB at "L" level.

The sequencer 25 executes the scan S2X to transfer the write data Din held in the latch circuit SDL of the plane PB0 to the latch circuit XDL.

When the read operation becomes executable, the sequencer 25 starts the read operation (second suspend read operation) in the plane PB2. The details of the second suspend read operation are the same as those in the first embodiment in FIG. 12.

When the read operation is complete, the logic controller 23 sets the signal /RB at "H" level.

When the semiconductor memory device 20 enters the ready state, the memory controller 10 repeatedly asserts the signal /RE. Every time the signal /RE is toggled, the read data Dout is output to the memory controller 10.

The subsequent operation is the same as that shown in FIG. 15.

2.2 Specific Examples of Operations of Register and PB Address Comparator

Four specific examples of the operations of the register and the PB address comparator will be described next.

2.2.1 First Example

Referring to FIG. 17, the description will be given of a first example, in which after a normal program operation, a plurality of planes PB suspend synchronous write operations and the first suspend read operation is executed. FIG. 17 shows an example of a command sequence related to the first suspend read operation and an example of a timing chart of various signals.

As shown in FIG. 17, first of all, the memory controller 10 transmits, for example, a command set (the command "80h", address ADD (PBX), data "Din", and command "10h") corresponding to a normal program operation in a plane PBX (where X is any integer from 0 to 15) to the semiconductor memory device 20.

When the command "10h" is received, in the register 24, latch circuits DIL and ACL in a latch circuit unit 24_X corresponding to the plane PBX latch "H" level. As a result, a signal DIL_PBX and a signal ACL_PBX are set at "H" level.

The logic controller 23 sets the signal /RE at "L" level. The sequencer 25 starts the write operation (normal program operation) in the plane PBX. The plane PBX is set in an operation state during the write operation in the plane PBX.

After the end of the write operation in the plane PBX, the logic controller 23 sets the signal /RB at "H" level.

Upon determining that the signal /RB is at "H" level, the memory controller 10 transmits, for example, a command set (the command "80h", address ADD (PB0), write data "Din", and command "11h") corresponding to a write operation in the plane PB0 to the semiconductor memory device 20 in order to execute synchronous write operations in a plurality of planes PB.

When the command "11h" is received, in the register 24, the latch circuits DIL and ACL in the latch circuit unit 24_0 corresponding to the plane PB0 latch "H" level. As a result, a signal DIL_PB0 and a signal ACL_PB0 are set at "H" level.

When the command "11h" is stored in the register 24, the logic controller 23 sets the signal /RB at "L" level. The sequencer 25 inputs the write data Din to the corresponding latch circuit XDL in the plane PB0. After the write data Din is input to the corresponding latch circuit XDL in the plane PB0, and the logic controller 23 sets the signal /RB at "H" level. The sequencer 25 waits for a command for instructing a write operation that is to be executed with the plane PB0.

The memory controller 10 then transmits a command set (the command "00h", address ADD (PB0), and command "30h") corresponding to a read operation in the plane PB0 to the semiconductor memory device 20. This causes the semiconductor memory device 20 to start the operation of suspending the input of the write data Din to the latch circuit XDL and generating a read operation interrupt in the plane PB0.

When the command "30h" is received, in the register 24, the latch circuit SPL in the latch circuit unit 24_0 corresponding to the plane PB0 latches "H" level, which sets the signal SPL_PB0 at "H" level.

The PB address comparator 28 sets the signal MTCH at "H" level in accordance with "H"-level signals DIL_PB0, ACL_PB0, and SPL_PB0. More specifically, because the signals DIL_PB0, ACL_PB0, and SPL_PB0 are at "H" level, an AND circuit 54 in a logical circuit unit 51_0 in the PB address comparator 28 outputs an "H"-level signal. As a result, an output signal MTCH from an OR circuit 52 is set "H" level.

The sequencer 25 executes a read operation (first suspend read operation) in the plane PB0 in accordance with the "H"-level signal MTCH. The plane PB0 is kept in the operation state during the execution of the first suspend read operation.

When the first suspend read operation is complete, in the register 24, a latch circuit SPL in a latch circuit unit 24_0 corresponding to the plane PB0 latches "L" level, which sets a signal SPL_PB0 at "L" level. As a result, the PB address comparator 28 sets the signal MTCH at "L" level.

Upon receiving the command "3Fh" after outputting the read data Dout, the logic controller 23 sets the signal /RB at "L" level, and the sequencer 25 starts the scan /S2X. The plane PB0 is kept in the operation state during the execution of the scan /S2X by the sequencer 25, and the latch circuit SPL in the latch circuit unit 24_0 corresponding to the plane PB0 latches "H" level.

When the scan /S2X is complete, the logic controller 23 sets the signal /RB at "H" level.

Upon determining that the signal /RB is at "H" level, the memory controller 10 transmits the command "48h" to the semiconductor memory device 20. Upon receiving the command "48h", the sequencer 25 waits for a command for instructing a write operation that is to be executed synchronously with the plane PB0.

For the case where the input of the write data Din in the plane PB0 has been suspended, the memory controller 10 transmits a command set (a command "85h", the address ADD (PB0), the write data "Din", and the command "11h"). The command "85h" is a command for informing the semiconductor memory device 20 that the suspended input of the write data Din is resumed. Note that the write data Din is only required to include data that has not been completely input to the latch circuit XDL in the plane PB0 before the suspension of the read operation. The sequencer 25 inputs the write data Din to the corresponding latch circuit XDL in the plane PB0.

After the write data Din is input to the corresponding latch circuit XDL in the plane PB0, the logic controller 23 sets the signal /RB at "H" level to inform the memory controller 10 that the semiconductor memory device 20 is in the ready state, and waits for a command for instructing a write operation that is to be synchronously executed with the plane PB0.

The memory controller 10 then transmits a command set (the command "80h", address ADD (PB1), write data "Din", and command "10h") corresponding to a write operation in the plane PB1.

When the command "10h" is received, in the register 24, the latch circuits DIL and ACL in the latch circuit units 24_0 and 24_1 latch "H" level.

Upon receiving the command "10h", the logic controller 23 sets the signal /RB at "L" level, and the sequencer 25 starts write operations synchronized between the planes PB0 and PB1. In each of the planes PB0 and PB1, the write data Din in the latch circuit XDL is transferred to the latch circuit SDL.

The planes PB0 and PB1 are kept in the operation state during the execution of synchronous write operations in the planes PB0 and PB1.

When the write operations synchronized between the planes PB0 and PB1 are complete, the logic controller 23 sets the signal /RB at "H" level.

2.2.2 Second Example

Figure 18:
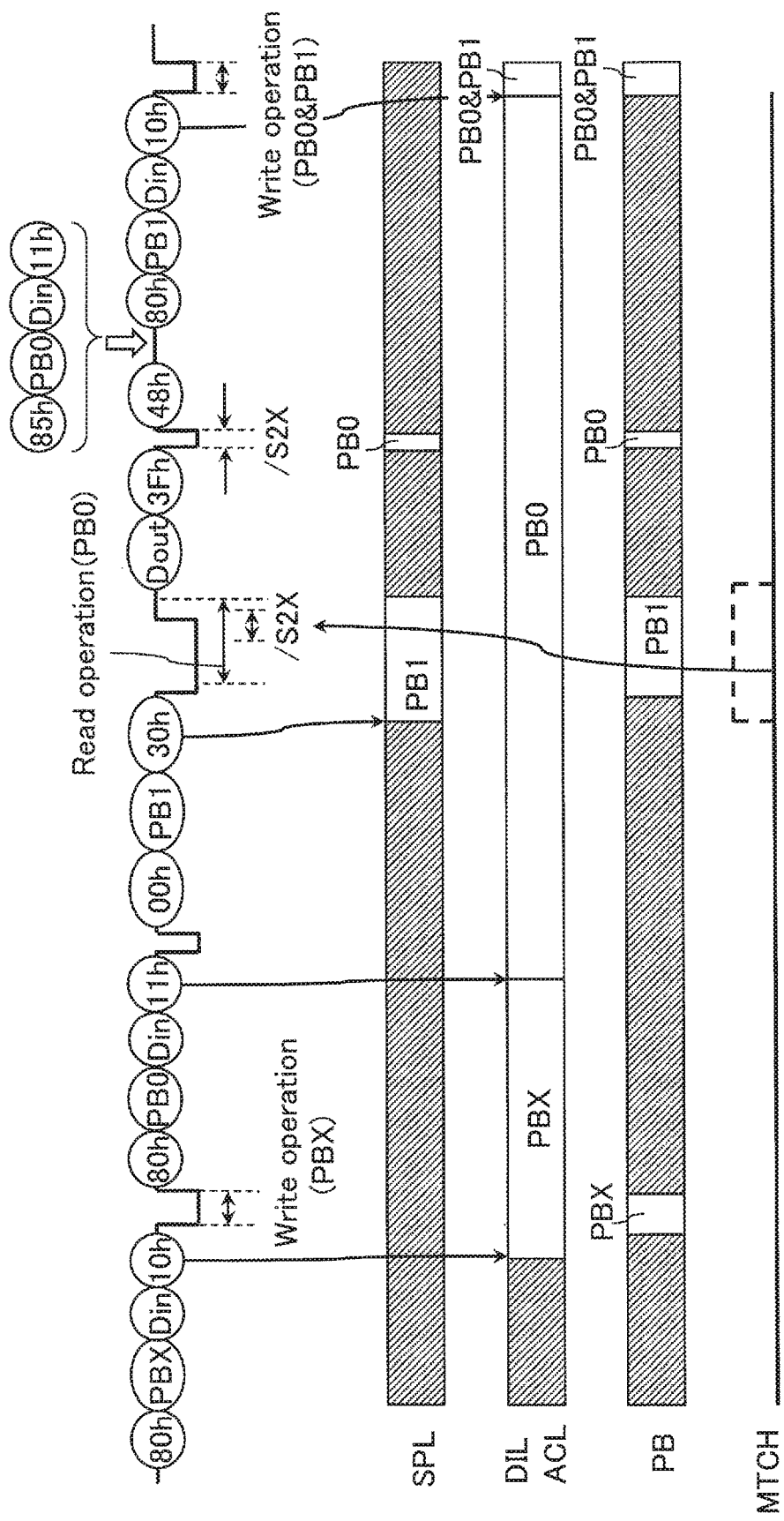
FIG. 18 shows an example of a command sequence related to the second suspend read operation and an example of a timing chart of various signals in the semiconductor memory device according to a second example of the second embodiment.

Referring to FIG. 18, the description will be given of a second example, in which after a normal program operation, a plurality of planes PB suspend synchronous write operations, and the second suspend read operation is executed. FIG. 18 shows an example of a command sequence related to the second suspend read operation and an example of a timing chart of various signals. This operation will be described, mainly focusing on differences from FIG. 17.

As shown in FIG. 18, as in the case shown in FIG. 17, the memory controller 10 transmits a command set (the command "80h", address ADD (PBX), data "Din", and command "10h") corresponding to a normal program operation in the plane PBX to the semiconductor memory device 20.

When the command "10h" is received, in the register 24, latch circuits DIL and ACL in a latch circuit unit 24_X corresponding to the plane PBX latch "H" level. As a result, a signal DIL_PBX and a signal ACL_PBX are set at "H" level.

The logic controller 23 sets the signal /RB at "L" level. The sequencer 25 starts the write operation (normal program operation) in the plane PBX. The plane PBX is set in an operation state during a write operation in the plane PBX.

After the end of the write operation in the plane PBX, the logic controller 23 sets the signal /RB at "H" level.

Upon determining that the signal /RB is at "H" level, the memory controller 10 transmits, for example, a command set (the command "80h", address ADD (PB0), write data "Din", and command "11h") corresponding to a write operation in the plane PB0 to the semiconductor memory device 20 in order to execute synchronous write operations in a plurality of planes PB.

When the command "11h" is received, in the register 24, the latch circuits DIL and ACL in the latch circuit unit 24_0 corresponding to the plane PB0 latch "H" level. As a result, a signal DIL_PB0 and a signal ACL_PB0 are set at "H" level.

When the command "11h" is stored in the register 24, the logic controller 23 sets the signal /RB at "L" level. The sequencer 25 inputs the write data Din to the corresponding latch circuit XDL in the plane PB0. After the write data Din is input to the corresponding latch circuit XDL in the plane PB0, and the logic controller 23 sets the signal /RB at "H" level. The sequencer 25 waits for a command for instructing a write operation that is to be executed synchronously with the plane PB0.

The memory controller 10 then transmits a command set (the command "00h", address ADD (PB1), and command "30h") corresponding to a read operation in the plane PB1 to the semiconductor memory device 20. This causes the semiconductor memory device 20 to start the operation of suspending the input of the write data Din in the plane PB0 to the latch circuit XDL and generating a read operation interrupt in the plane PB1.

When the command "30h" is received, in the register 24, the latch circuit SPL in the latch circuit unit 24_1 corresponding to the plane PB1 latches "H" level, which sets the signal SPL_PB1 at "H" level. As a result, the PB address comparator 28 sets the signal MTCH at "L" level. More specifically, in the logical circuit unit 51_0 in the PB address comparator 28, because the signals DIL_PB0 and ACL_PB0 are at "H" level and the signal SPL_PB0 is at "L" level, the AND circuit 54 outputs an "L"-level signal. In addition, in the logical circuit unit 51_1, because the signals DIL_PB1 and ACL_PB1 are at "L" level and the signal SPL_PB1 is at "H" level, the AND circuit 54 outputs an "L"-level signal. As a result, the output signal MTCH from the OR circuit 52 is set at "L" level.

The sequencer 25 executes a read operation (second suspend read operation) in the plane PB1 in accordance with the "L"-level signal MTCH. The plane PB1 is kept in the operation state during the execution of the second suspend read operation.

When the second suspend read operation is complete, in the register 24, the latch circuit SPL in a latch circuit unit 24_1 corresponding to the plane PB1 latches "L" level, which sets a signal SPL_PB1 at "L" level. Subsequently, signal MTCH is set at "L" level.

Upon receiving the command "3Fh" after outputting the read data Dout, the logic controller 23 sets the signal /RB at "L" level, and the sequencer 25 starts the scan /S2X. The plane PB0 is kept in the operation state during the execution of the scan /S2X by the sequencer 25, and the latch circuit SPL in the latch circuit unit 24_0 corresponding to the plane PB0 latches "H" level.

When the scan /S2X is complete, the logic controller 23 sets the signal /RB at "H" level.

Upon determining that the signal /RB is at "H" level, the memory controller 10 transmits the command "48h" to the semiconductor memory device 20. Upon receiving the command "48h", the sequencer 25 waits for a command for instructing a write operation that is to be executed synchronously with the plane PB0.

The subsequent operation is the same as that in the first example.

2.2.3 Third Example

Figure 19:
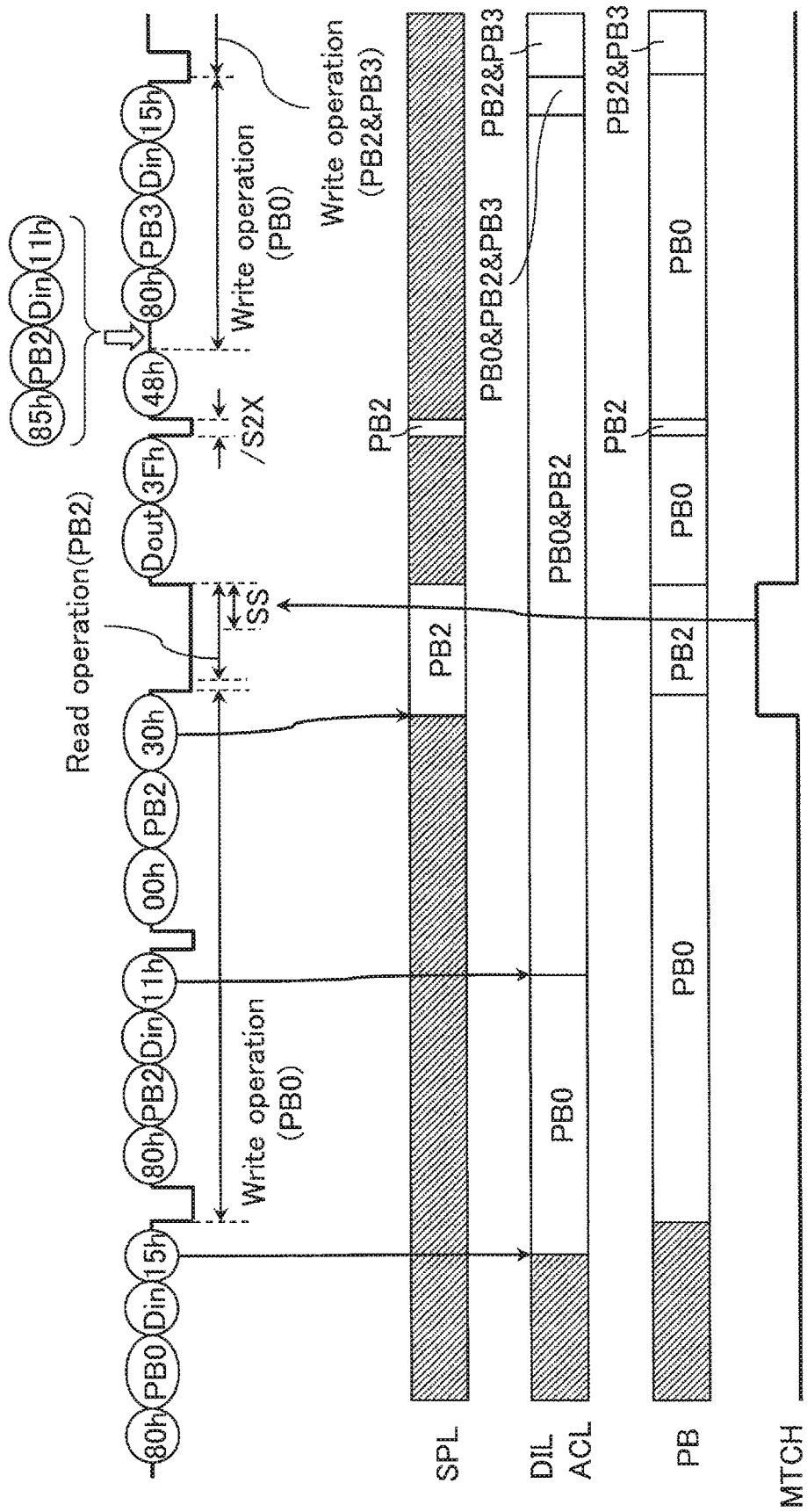
FIG. 19 shows an example of a command sequence related to the first suspend read operation and an example of a timing chart of various signals in the semiconductor memory device according to a third example of the second embodiment.

Referring to FIG. 19, the description will be given of a third example, in which after a cache program operation, a plurality of planes PB suspend synchronous write operations, and the first suspend read operation is executed. FIG. 19 shows an example of a command sequence related to the first suspend read operation and an example of a timing chart of various signals.

As shown in FIG. 19, first of all, the memory controller 10 transmits, for example, a command set (the command "80h", address ADD (PB0), data "Din", and command "15h") corresponding to a cache program operation in the plane PB0 to the semiconductor memory device 20.

When the command "15h" is received, in the register 24, latch circuits DIL and ACL in a latch circuit unit 24_0 corresponding to the plane PB0 latch "H" level. As a result, a signal DIL_PB0 and a signal ACL_PB0 are set at "H" level.

The logic controller 23 sets the signal /RB at "L" level. The sequencer 25 starts the write operation (cache program operation) in the plane PB0. The plane PB0 is set in an operation state.

After the write data Din is transferred from the latch circuit XDL to the latch circuit SDL in the plane PB0, the logic controller 23 sets the signal /RB at "H" level.

Upon determining that the signal /RB is at "H" level, the memory controller 10 transmits, for example, a command set (the command "80h", address ADD (PB2), write data "Din", and command "11h") corresponding to a write operation in the plane PB2 to the semiconductor memory device 20 in order to execute synchronous write operations in a plurality of planes PB.

When the command "11h" is received, in the register 24, the latch circuits DIL and ACL in the latch circuit units 24_0 and 24_2 respectively corresponding to the planes PB0 and PB2 latch "H" level. As a result, the signals DIL_PB0, DIL_PB2, ACL_PB0, and ACL_PB2 are set at "H" level.

When the command "11h" is stored in the register 24, the logic controller 23 sets the signal /RB at "L" level. The sequencer 25 inputs the write data Din to the corresponding latch circuit XDL in the plane PB2. After the write data Din is input to the corresponding latch circuit XDL in the plane PB2, and the logic controller 23 sets the signal /RB at "H" level. The sequencer 25 waits for a command for instructing a write operation that is to be executed synchronously with the plane PB2.

The memory controller 10 then transmits a command set (the command "00h", address ADD (PB2), and command "30h") corresponding to a read operation in the plane PB2 to the semiconductor memory device 20. This causes the semiconductor memory device 20 to start the operation of suspending the input of the write data Din to the latch circuit XDL and generating a read operation interrupt in the plane PB2.

When the command "30h" is received, in the register 24, the latch circuit SPL in the latch circuit unit 24_2 corresponding to the plane PB2 latches "H" level, which sets the signal SPL_PB2 at "H" level. As a result, the PB address comparator 28 sets the signal MTCH at "H" level. More specifically, in the logical circuit unit 51_0 in the PB address comparator 28, because the signals DIL_PB0 and ACL_PB0 are at "H" level and the signal SPL_PB0 is at "L" level, the AND circuit 54 outputs an "L"-level signal. In addition, in the logical circuit unit 51_2, because the signals DIL_PB2, ACL_PB2, and SPL_BP2 are at "H" level, the AND circuit 54 outputs an "H"-level signal. As a result, the output signal MTCH from the OR circuit 52 is set at "H" level.

In addition, upon receiving the command "30h", the sequencer 25 suspends a cache program operation in the plane PB0. The plane PB0 is kept in the operation state during the execution of the cache program operation.

The sequencer 25 executes a read operation (first suspend read operation) in the plane PB2 in accordance with the "H"-level signal MTCH. The plane PB2 is kept in the operation state during the execution of the first suspend read operation.

When the first suspend read operation is complete, in the register 24, a latch circuit SPL in a latch circuit unit 24_2 corresponding to the plane PB2 latches "L" level, which sets a signal SPL_PB2 at "L" level. As a result, the PB address comparator 28 sets the signal MTCH at "L" level.

In addition, when the first suspend read operation is complete, the plane PB0 in which the cache program operation is suspended is set in the operation state.

Upon receiving the command "3Fh" after outputting the read data Dout, the logic controller 23 sets the signal /RB at "L" level, and the sequencer 25 starts the scan /S2X in the plane PB2. The plane PB2 is kept in the operation state during the execution of the scan /S2X by the sequencer 25, and the latch circuit SPL in the latch circuit unit 24_2 corresponding to the plane PB2 latches "H" level.

When the scan /S2X is complete, the logic controller 23 sets the signal /RB at "H" level. In addition, the plane PB0 in which the cache program operation is suspended is set in the operation state.

Upon determining that the signal /RB is at "H" level, the memory controller 10 transmits the command "48h" to the semiconductor memory device 20. Upon receiving the command "48h", the sequencer 25 resumes the cache write operation in the plane PB0. The sequencer 25 also waits for a command for instructing a write operation that is to be executed synchronously with the plane PB2.

For the case where the input of the write data Din in the plane PB2 has been suspended, the memory controller 10 transmits a command set (a command "85h", the address ADD (PB2), the write data "Din", and the command "11h"). The sequencer 25 inputs the write data Din to the corresponding latch circuit XDL in the plane PB2. After the write data Din is input to the corresponding latch circuit XDL in the plane PB2, the logic controller 23 sets the signal /RB at "H" level to inform the memory controller 10 that the semiconductor memory device 20 is in the ready state, and waits for a command for instructing a write operation that is to be synchronously executed with the plane PB2.

The memory controller 10 then transmits a command set (the command "80h", address ADD (PB3), write data "Din", and command "15h") corresponding to a write operation in the plane PB3.

When the command "15h" is received, in the register 24, the latch circuits DIL and ACL in the latch circuit units 24_0, 24_2, and 24_3 latch "H" level.

When the cache write operation in the plane PB0 is complete, the latch circuits DIL and ACL in the latch circuit unit 24_0 corresponding to the plane PB0 latch "L" level. That is, the latch circuits DIL and ACL in the latch circuit units 24_2 and 24_3 latch "H" level.

The logic controller 23 sets the signal /RB at "L" level, and the sequencer 25 starts write operations synchronized between the planes PB2 and PB3. During the operations, in each of the planes PB2 and PB3, the write data Din in the latch circuit XDL is transferred to the latch circuit SDL.

When the transfer of the write data Din from the latch circuit XDL to the latch circuit SDL is complete in each of the planes PB2 and PB3, the logic controller 23 sets the signal /RB at "H" level.

The planes PB2 and PB3 are kept in the operation state during the execution of the write operations.

2.2.4 Fourth Example

Figure 20:
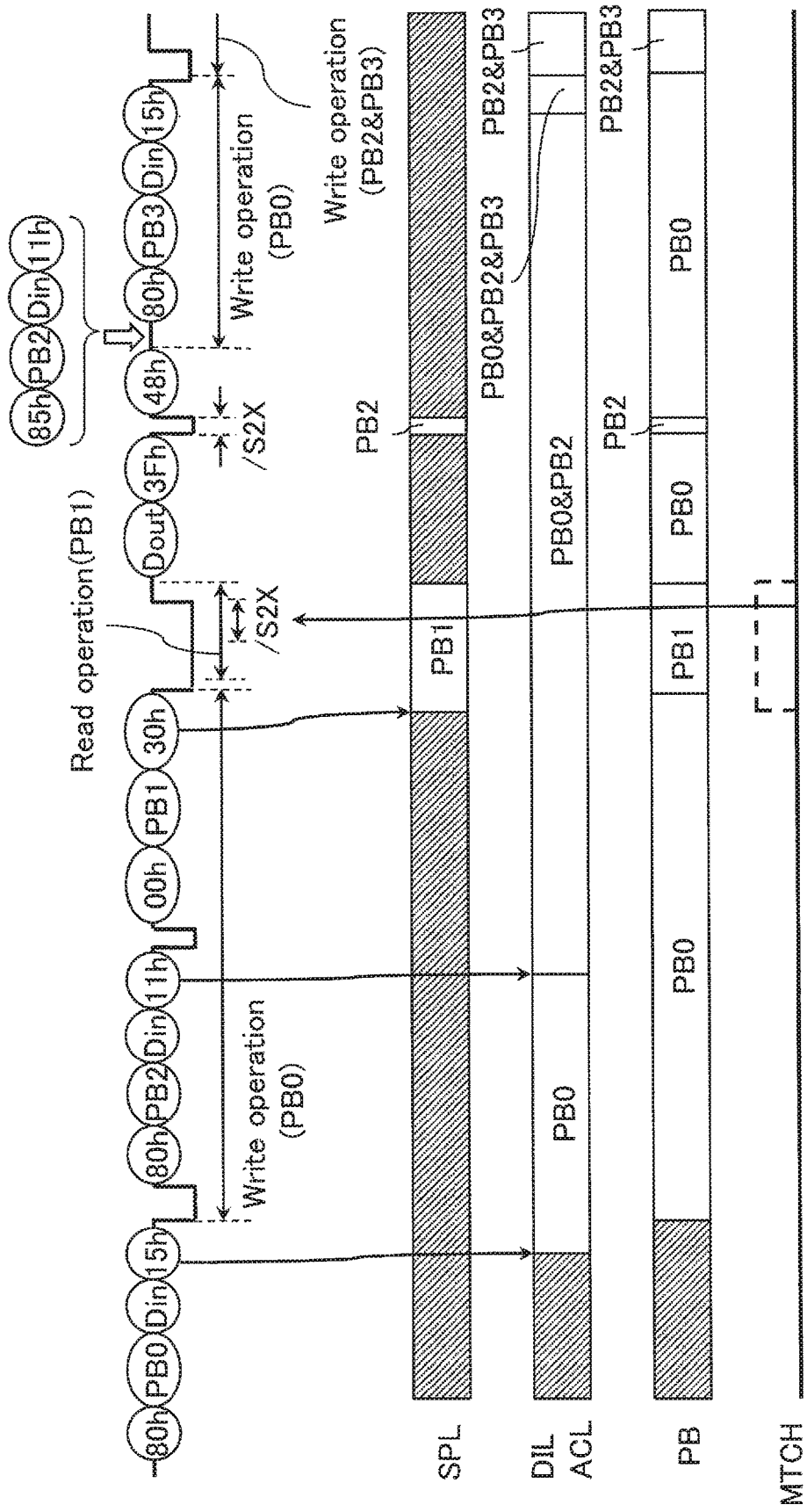
FIG. 20 shows an example of a command sequence related to the second suspend read operation and an example of a timing chart of various signals in the semiconductor memory device according to a fourth example of the second embodiment.

Referring to FIG. 20, the description will be given of a fourth example, in which after a cache program operation, a plurality of planes PB suspend synchronous write operations, and the second suspend read operation is executed. FIG. 20 shows an example of a command sequence related to the second suspend read operation and an example of a timing chart of various signals.

As shown in FIG. 20, as in the case shown in FIG. 17, the memory controller 10 transmits a command set (the command "80h", address ADD (PB0), data "Din", and command "15h") corresponding to a cache program operation in the plane PB0 to the semiconductor memory device 20.

When the command "15h" is received, in the register 24, latch circuits DIL and ACL in a latch circuit unit 24_0 corresponding to the plane PB0 latch "H" level. As a result, a signal DIL_PB0 and a signal ACL_PB0 are set at "H" level.

The logic controller 23 sets the signal /RB at "L" level. The sequencer 25 starts the write operation (cache program operation) in the plane PB0. The plane PB0 is set in an operation state.

After the write data Din is transferred from the latch circuit XDL to the latch circuit SDL in the plane PB0, the logic controller 23 sets the signal /RB at "H" level.

Upon determining that the signal /RB is at "H" level, the memory controller 10 transmits, for example, a command set (the command "80h", address ADD (PB2), write data "Din", and command "11h") corresponding to a write operation in the plane PB2 to the semiconductor memory device 20 in order to execute synchronous write operations in a plurality of planes PB.

When the command "11h" is received, in the register 24, the latch circuits DIL and ACL in the latch circuit units 24_0 and 24_2 respectively corresponding to the planes PB0 and PB2 latch "H" level. As a result, the signals DIL_PB0, DIL_PB2, ACL_PB0, and ACL_PB2 are set at "H" level.

When the command "11h" is stored in the register 24, the logic controller 23 sets the signal /RB at "L" level. The sequencer 25 inputs the write data Din to the corresponding latch circuit XDL in the plane PB2. After the write data Din is input to the corresponding latch circuit XDL in the plane PB2, and the logic controller 23 sets the signal /RB at "H" level. The sequencer 25 waits for a command for instructing a write operation that is to be executed synchronously with the plane PB2.

The memory controller 10 then transmits a command set (the command "00h", address ADD (PB1), and command "30h") corresponding to a read operation in the plane PB1 to the semiconductor memory device 20. This causes the semiconductor memory device 20 to start the operation of suspending the input of the write data Din to the latch circuit XDL and generating a read operation interrupt in the plane PB1.

When the command "30h" is received, in the register 24, the latch circuit SPL in the latch circuit unit 24_1 corresponding to the plane PB1 latches "H" level, which sets the signal SPL_PB1 at "H" level. As a result, the PB address comparator 28 sets the signal MTCH at "H" level. More specifically, in the logical circuit unit 51_0 in the PB address comparator 28, because the signals DIL_PB0 and ACL_PB0 are at "H" level and the signal SPL_PB0 is at "L" level, the AND circuit 54 outputs an "L"-level signal. In the logical circuit unit 51_1, because the signals DIL_PB1 and ACL_PB1 are at "L" level and the signal SPL_PB1 is at "H" level, the AND circuit 54 outputs an "L"-level signal. In addition, in the logical circuit unit 51_2, because the signals DIL_PB2 and ACL_PB2 are at "H" level and the signal SPL_PB2 is at "L" level, the AND circuit 54 outputs an "L"-level signal. As a result, the output signal MTCH from the OR circuit 52 is set at "L" level.

In addition, upon receiving the command "30h", the sequencer 25 suspends a cache program operation in the plane PB0. The plane PB0 is kept in the operation state during the execution of the cache program operation.

The sequencer 25 executes a read operation (second suspend read operation) in the plane PB1 in accordance with the "L"-level signal MTCH. The plane PB1 is kept in the operation state during the execution of the second suspend read operation.

When the second suspend read operation is complete, in the register 24, the latch circuit SPL in the latch circuit unit 24_1 corresponding to the plane PB1 latches "L" level, which sets a signal SPL_PB1 at "L" level. Subsequently, the signal MTCH is kept at "L" level.

In addition, when the second suspend read operation is complete, the plane PB0 in which the cache program operation is suspended is set in the operation state.

Upon receiving the command "3Fh" after outputting the read data Dout, the logic controller 23 sets the signal /RB at "L" level, and the sequencer 25 starts the scan /S2X in the plane PB2. The plane PB2 is kept in the operation state during the execution of the scan /S2X by the sequencer 25, and the latch circuit SPL in the latch circuit unit 24_2 corresponding to the plane PB2 latches "H" level.

When the scan /S2X is complete, the logic controller 23 sets the signal /RB at "H" level. In addition, the plane PB0 in which the cache program operation is suspended is set in the operation state.

Upon determining that the signal /RB is at "H" level, the memory controller 10 transmits the command "48h" to the semiconductor memory device 20. Upon receiving the command "48h", the sequencer 25 resumes the cache write operation in the plane PB0. The sequencer 25 also waits for a command for instructing a write operation that is to be executed synchronously with the plane PB2.

The subsequent operation is the same as that in the third example.

2.3 Effects According to Embodiment

The configuration according to this embodiment can obtain the same effects as those of the first embodiment.

3. Modifications and Like

A semiconductor memory device according to embodiments includes: a plurality of planes (PB) each including a memory cell array (21_1) including a plurality of memory cells (MT); a comparator (28) configured to, when suspending a write operation and executing a read operation, compare a first plane address corresponding to the write operation with a second plane address corresponding to the read operation; and a controller (25) configured to suspend the write operation and execute the read operation. The read operation includes a first read operation and a second read operation. The controller is configured to, based on an output signal (MTCH) from the comparator, execute the first read operation (first suspend read operation) when the first plane address corresponding to the write operation matches the second plane address corresponding the read operation, and execute the second read operation (second suspend read operation) when the first plane address corresponding to the write operation differs from the second plane address corresponding the read operation.

Applying the above embodiments can provide a semiconductor memory device that can improve the processing capability. Note that the embodiments are not limited to the forms described above, and various modifications can be made.

The above embodiments have exemplified the case in which a write operation is suspended, and a read operation is executed. However, a read operation may be executed after suspension of an erase operation.

In the above embodiments, the memory cell transistor MT may be configured to hold data of two or more bits. For example, the embodiments can also be applied to a write operation and a read operation for data of two or more bits.

In addition, for example, in the above embodiments, write operations may include the smart verify operation of changing a program voltage in accordance with the result of a verify operation executed in the past and the quick pass write operation of setting a plurality of verify voltages for one threshold level and changing a program voltage.

In the above embodiments, a state of "coupling" includes a state in which coupling is made via another element such as a transistor or resistor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of planes each including a memory cell array including a plurality of memory cells;
a comparator configured to, when suspending a write operation and executing a read operation, compare a first plane address corresponding to the write operation with a second plane address corresponding to the read operation; and
a controller configured to suspend the write operation and execute the read operation,
wherein the read operation includes a first read operation and a second read operation, and the controller is configured to, based on an output signal from the comparator, execute the first read operation when the first plane address corresponding to the write operation matches the second plane address corresponding the read operation, and execute the second read operation when the first plane address corresponding to the write operation differs from the second plane address corresponding the read operation.

2. The device according to claim 1, wherein:
the first read operation includes a first transfer operation for data and a second transfer operation for data, and
the second read operation includes the first transfer operation and a third transfer operation for data.

3. The device according to claim 2, further comprising an input and output circuit configured to transmit and receive data to and from an outside,
wherein each of the planes includes
a sense amplifier circuit configured to be electrically coupled to a first memory cell of the memory cells,
a first latch circuit coupled to the sense amplifier circuit, and
a second latch circuit coupled to the sense amplifier circuit, the first latch circuit, and the input and output circuit, and
the first transfer operation includes an operation of transferring data from the first latch circuit to the second latch circuit,
the second transfer operation includes an operation of transferring write data from the second latch circuit to the sense amplifier circuit, an operation of transferring read data from the first latch circuit to the second latch circuit, and an operation of transferring the write data from the sense amplifier circuit to the first latch circuit, and
the third transfer operation includes an operation of transferring inverted data from the first latch circuit to the second latch circuit.

4. The device according to claim 3, wherein the controller is configured to, in the first read operation, execute an operation of transferring the read data from the sense amplifier to the first latch circuit after the first transfer operation, and execute an operation of transferring the read data from the second latch circuit to the input and output circuit after execution of the second transfer operation.

5. The device according to claim 3, wherein the controller is configured to, in the second read operation, execute the third transfer operation concurrently with an operation of transferring the read data from the sense amplifier to the first latch circuit after the first transfer operation.

6. The device according to claim 4, wherein the controller is configured to resume the write operation after execution of the third operation when resuming the write operation after execution of the first read operation.

7. The device according to claim 1, wherein the semiconductor memory device is set in a busy state during execution of the first read operation when executing the first read operation, and is changed from the busy state to a ready state before an end of the second read operation when executing the second read operation.

8. The device according to claim 1, wherein the read operation includes a third read operation, and
the controller executes a third read operation when executing the read operation without suspending the write operation.

9. The device according to claim 1, further comprising a register configured to hold a plane address,
wherein the register transmits, to the comparator, a first signal corresponding to a third plane address included in a write instruction, a second signal corresponding to the first plane address corresponding to the write operation, and a third signal corresponding to the second plane address corresponding to the read operation.

10. The device according to claim 9, wherein:
when at least one of the first signal and the second signal is at a first logical level and the third signal is at the first logical level, the comparator sets the output signal at the first logical level, and
the controller is configured to execute the first read operation when the output signal is at the first logical level.

11. The device according to claim 1, wherein each of the planes includes:
a sense amplifier circuit configured to be electrically coupled to a first memory cell of the memory cells,
a first latch circuit coupled to the sense amplifier circuit, and
a second latch circuit coupled to the sense amplifier circuit, the first latch circuit, and the input and output circuit, and
the write operation includes a first write operation and a second write operation, and
the semiconductor memory device is set in a busy state during execution of the first write operation when executing the first write operation, and is changed from the busy state to a ready state upon completion of transfer of write data to the first latch circuit when executing the second write operation.

12. The device according to claim 11, wherein:
when the first read operation is executed after suspension of the first write operation, a standby period is provided from when a first command for suspending the first write operation is received to when a second command corresponding to the first read operation is received, and
when the first read operation is executed after suspension of the second write operation, the standby period is provided from when the second command is received to when the first read operation is executed.

13. The device according to claim 1, wherein:
in the write operation, a program cycle including a program operation and a verify operation is repeatedly executed, and
when the write operation is resumed, the verify operation is executed first.

14. The device according to claim 2, wherein:
each of the planes includes a row decoder coupled to the memory cells, and
the first read operation and the second read operation each include a first operation of setting a row address corresponding to the write operation in the row decoder after data is read.

15. The device according to claim 14, wherein:
in the first read operation, a second transfer operation is executed after the first operation, and
in the second read operation, the first operation is executed after the third transfer operation.

16. The device according to claim 14, wherein:
in the first read operation, the semiconductor memory device is set in a busy state during the first operation and the second transfer operation, and
in the second read operation, the semiconductor memory device is set in a ready state during the first operation.

17. The device according to claim 1, wherein the memory cells include charge storage layers.

18. The device according to claim 1, wherein the semiconductor memory device is a NAND flash memory.

* * * * *